(12) United States Patent
Celinska et al.

(10) Patent No.: US 6,815,223 B2
(45) Date of Patent: Nov. 9, 2004

(54) LOW THERMAL BUDGET FABRICATION OF FERROELECTRIC MEMORY USING RTP

(75) Inventors: Jolanta Celinska, Colorado Springs, CO (US); Vikram Joshi, Colorado Springs, CO (US); Narayan Solayappan, Colorado Springs, CO (US); Myoungho Lim, Colorado Springs, CO (US); Larry D. McMillan, Colorado Springs, CO (US); Carlos A. Paz de Araujo, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 10/302,441

(22) Filed: Nov. 22, 2002

(65) Prior Publication Data

US 2004/0101977 A1 May 27, 2004

(51) Int. Cl.⁷ .................................................. H01G 7/06
(52) U.S. Cl. .......................................... 438/3; 438/240
(58) Field of Search .............................. 438/3, 238–240, 438/381; 363/15, 17, 98, 125

(56) References Cited

U.S. PATENT DOCUMENTS

| | | |
|---|---|---|
| 5,046,043 A | 9/1991 | Miller et al. |
| 5,122,923 A | 6/1992 | Matsubara et al. |
| 5,434,102 A | 7/1995 | Watanabe et al. |
| 5,468,684 A | 11/1995 | Yoshimori et al. |
| 5,508,226 A | 4/1996 | Ito et al. |
| 5,648,114 A | 7/1997 | Paz De Araujo et al. |
| 5,728,603 A * | 3/1998 | Emesh et al. .................. 438/3 |
| 5,825,057 A | 10/1998 | Watanabe et al. |
| 5,962,069 A | 10/1999 | Schindler et al. |
| 6,151,240 A * | 11/2000 | Suzuki ....................... 365/145 |
| 6,323,057 B1 * | 11/2001 | Sone ......................... 438/104 |
| 6,326,315 B1 | 12/2001 | Uchiyama et al. |
| 6,340,600 B1 * | 1/2002 | Joo et al. ........................ 438/3 |
| 6,388,281 B1 * | 5/2002 | Jung et al. ................... 257/295 |
| 6,541,375 B1 * | 4/2003 | Hayashi et al. .............. 438/679 |
| 6,562,678 B1 * | 5/2003 | Uchiyama et al. ........... 438/240 |
| 6,706,585 B2 * | 3/2004 | Uchiyama et al. ........... 438/240 |

OTHER PUBLICATIONS

Koyama et al., "A Stacked Capacitor With (BaxSr1–x)TIO3 For 256M DRAM", IEEE, 1991, pp. 823–826.

* cited by examiner

*Primary Examiner*—H. Jey. Tsai
(74) *Attorney, Agent, or Firm*—Patton Boggs LLP

(57) ABSTRACT

A precursor for forming a thin film of layered superlattice material is applied to an integrated circuit substrate. The precursor coating is heated using rapid thermal processing (RTP) with a ramping rate of 100° C./second at a hold temperature in a range of from 500° C. to 900° C. for a cumulative heating time not exceeding 30 minutes, and preferably less than 5 minutes. In fabricating a ferroelectric memory cell, the coating is heated in oxygen using RTP, then a top electrode layer is formed, and then the substrate including the coating is heated using RTP in oxygen or in nonreactive gas after forming the top electrode layer. The thin film of layered superlattice material preferably comprises strontium bismuth tantalate or strontium bismuth tantalum niobate, and preferably has a thickness in a range of from 25 nm to 120 nm. The process of fabricating a thin film of layered superlattice material typically has a thermal budget value not exceeding 960,000° C.-sec, preferably less than 50,000° C.-sec.

29 Claims, 8 Drawing Sheets

US 6,815,223 B2

LOW THERMAL BUDGET FABRICATION OF FERROELECTRIC MEMORY USING RTP

FIELD OF THE INVENTION

The invention in general relates to the fabrication of dielectric and ferroelectric metal oxides in integrated circuits, and in particular, to the formation of nonvolatile integrated circuit memories containing ferroelectric layered superlattice materials.

BACKGROUND OF THE INVENTION

Ferroelectric compounds possess favorable characteristics for use in nonvolatile integrated circuit memories. See U.S. Pat. No. 5,046,043 issued Sep. 3, 1991 to Miller et al. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. U.S. Pat. No. 5,434,102 issued Jul. 18, 1995 to Watanabe et al., and U.S. Pat. No. 5,468,684 issued Nov. 21, 1995, to Yoshimori et al., describe processes for integrating these materials into practical integrated circuits.

A typical ferroelectric memory in an integrated circuit contains a semiconductor substrate and a metal-oxide semiconductor field-effect transistor (MOSFET) electrically connected to a ferroelectric device, usually a ferroelectric capacitor. Layered superlattice materials currently in use and development comprise metal oxides. In conventional fabrication methods, crystallization of the metal oxides to produce desired electronic properties requires heat treatments in oxygen-containing gas at elevated temperatures. The individual heating steps in the presence of oxygen are typically performed at a temperature in the range of from 700° C. to 900° C. for 60 minutes to three hours. As a result of the presence of reactive oxygen at elevated temperatures, numerous defects, such as dangling bonds, are generated in the crystal structure of the semiconductor silicon substrate, leading to deterioration in the electronic characteristics of the MOSFET. Good ferroelectric properties have been achieved in the prior art using process heating temperatures at about 700° C. to crystallize layered superlattice material. See U.S. Pat. No. 5,508,226 issued Apr. 16, 1996, to Ito et al. Nevertheless, the total duration of annealing and other heating steps at 700° C. to 900° C. in methods disclosed in the prior art is typically in a range of about two to four hours or more, which may be economically unfeasible. More importantly, long exposure times of 30 minutes or more in oxygen, even at the somewhat reduced temperature ranges, typically results in oxygen damage to the semiconductor substrate and other elements of the CMOS circuit.

After completion of the integrated circuit, the presence of oxides may still cause problems because oxygen atoms from a thin film of metal oxide layered superlattice material tend to diffuse through the various materials contained in the integrated circuit and combine with atoms in the substrate and in semiconductor layers, forming undesired oxides. Undesired diffusion of oxygen is proportional to temperature and to the amount of time at elevated temperature. The resulting oxides interfere with the function of the integrated circuit; for example, they may act as dielectrics in the semiconducting regions, thereby forming virtual capacitors. Diffusion of atoms from the underlying substrate and other circuit layers into the ferroelectric metal oxide is also a problem; for example, silicon from a silicon substrate and from polycrystalline silicon contact layers is known to diffuse into layered superlattice material and degrade its ferroelectric properties. For relatively low-density applications, the ferroelectric memory capacitor was placed on the side of the underlying CMOS circuit, and this reduced somewhat the problem of undesirable diffusion of atoms between circuit elements. Nevertheless, as the market demand and the technological ability to manufacture high-density circuits increase, the distance between circuit elements decreases, and the problem of molecular and atomic diffusion between elements becomes more acute. To achieve high circuit density by reducing circuit area, the ferroelectric capacitor of a memory cell is placed virtually on top of the switch element, typically a field-effect transistor (hereinafter "FET"), and the switch and bottom electrode of the capacitor are electrically connected by a conductive plug. To inhibit undesired diffusion, a barrier layer is located under the ferroelectric oxide, between the capacitor's bottom electrode and the underlying layers. The barrier layer not only must inhibit the diffusion of oxygen and other chemical species that may cause problems; it must also be electrically conductive, to enable electrical connection between the capacitor and the switch. The maximum processing temperature tolerable with current barrier technology and fabrication methods is in a range of about 650° C. to 700° C. At temperatures in this range or higher for more than even a few minutes, the highest-temperature barrier materials quickly begin to degrade and to lose their diffusion-barrier properties. On the other hand, methods of forming layered superlattice materials disclosed in the prior art include heating the layered superlattice material and the associated memory stack in oxygen using RTP and furnace annealing (or in oxygen for part of the time, and in nonreactive gas part of the time) at temperatures in a range of about 650° C. to 800° C., for a minimum total duration of 60 minutes, but usually for two hours or longer. This prolonged heating at elevated temperature was done to achieve good crystallization of deposited layered superlattice materials. Nevertheless, such prolonged heating at elevated temperature typically damages semiconductor substrate, conductive plugs, diffusion barriers and other elements of integrated circuits.

It is common in the art to use rapid thermal processing ("RTP") before furnace annealing to improve ferroelectric or dielectric properties of deposited metal oxide thin films, in particular, of layered superlattice materials. Methods using RTP before oxygen annealing are described in U.S. Pat. No. 5,648,114 issued Jul. 15, 1997 to Paz de Araujo et al., and U.S. Pat. No. 5,825,057 issued Oct. 20, 1998 to Watanabe et al. The RTP disclosed in the prior art is typically conducted at a temperature of 700° C. to 850° C. for a hold time of about 30 seconds, followed by an oxygen furnace anneal at 700–800° C. for 30 to 60 minutes, followed by a furnace post-anneal at 700–800° C. for 30 to 60 minutes in oxygen after formation of a top electrode and milling of the capacitor. In a variation, U.S. Pat. No. 6,326,315 B1 issued Dec. 4, 2001 to Uchiyama et al. teaches a ferroelectric anneal step in oxygen using an RTP-technique at 650° C. for 30 minutes, followed by a furnace post-anneal at 650° C. for 30 minutes in oxygen after formation of a top electrode and milling of the capacitor. Another approach of the prior art for making memory capacitors containing layered superlattice material is to conduct relatively low-temperature heating in oxygen (e.g., 600° C. or less) and higher-temperature heating in inert gas (e.g., in nitrogen at 800° C.). See, for example, U.S. Pat. No. 5,962,069 issued Oct. 5, 1999 to Schindler et al. Thus, these methods typically involve processing at elevated temperatures of 650° C. or higher for a minimum total duration in excess of 60 minutes.

Metal oxide materials, such as barium strontium titanate ("BST") and other $ABO_3$-type perovskites, are important for making integrated circuit thin film capacitors having high dielectric constants. Such capacitors are useful in fabricating integrated circuit memories, such as DRAMs. See for example, Kuniaki Koyama et al., "A Stacked Capacitor with $(Ba_xSr_{1-x})TiO_3$ For 256M DRAM" in IDEM (International Electron Devices Meeting) Technical Digest, December 1991, pp. 32.1.1–32.1.4, and U.S. Pat. No. 5,122,923, issued to Shogo Matsubara et al. PZT and PLZT compounds are $ABO_3$-type perovskites having ferroelectric properties useful in ferroelectric memories. Fabrication of integrated circuits containing $ABO_3$-type perovskites and other dielectric and ferroelectric metal oxides using processes at elevated temperatures as described above with reference to layered superlattice materials results in similar problems of undesired diffusion and structural damage, resulting in degradation of electronic properties.

SUMMARY OF THE INVENTION

The present invention helps solve some of the problems mentioned above by providing a method with a low thermal budget ("LTB") for fabricating an integrated circuit memory and other devices containing metal oxide material. In particular, embodiments in accordance with the invention provide integrated circuit devices containing ferroelectric layered superlattice having good ferroelectric and circuit characteristics, such as high-polarizability, low fatigue, low-leakage current, and high breakdown voltage.

The term "thermal budget" herein refers generally to the total amount of time that an integrated circuit substrate is heated at elevated temperatures. The term "elevated temperature" used in this specification regarding the fabrication of metal oxide material, in particular, layered superlattice materials, generally means temperatures above 500° C., typically in a range of about 500° C. to 900° C. It is an object of embodiments in accordance with the invention to reduce the thermal budget during fabrication of an integrated circuit device, while maintaining good ferroelectric and electronic properties. In one aspect, a method having a low thermal budget in accordance with the invention generally minimizes the cumulative heating time that an integrated circuit substrate is heated above 550° C.; especially, it minimizes the thermal budget of operations conducted above 700° C. The terms "cumulative heating time", "total heating time" and related terms in the specification designate the time during fabrication steps that an integrated circuit substrate is heated at a temperature of 500° C. or greater after an initial precursor coating is deposited on the substrate. During fabrication of an integrated circuit memory containing a capacitor comprising metal oxide dielectric material, in particular, ferroelectric layered superlattice material, the cumulative heating time refers practically to the total duration of substrate heating above 500° C. from the point of starting to deposit an initial precursor coating on the substrate to the point of forming metallization and wiring layers on the completed memory cell. In the prior art, when a substrate including a ferroelectric coating was heated by RTP and furnace at a temperature of 650° C. for 30 minutes, before forming a top electrode, and thereafter heated again in a furnace at 700° C. for 60 minutes after formation of a top electrode, then the cumulative heating time was 90 minutes. In contrast, representative exemplary cumulative heating times in methods in accordance with the invention are about two to three minutes or less.

The term "thermal budget" is also used herein in reference to a product of: (elevated processing temperature) multiplied by (time at elevated processing temperature). It has been observed that damage to an integrated circuit resulting from heating at a given temperature decreases by reducing the duration of heating at that temperature. Further, it has been observed that damage to the integrated circuit further decreases by utilizing RTP heating. Damage from heating an integrated circuit also decreases by heating at an increased temperature for a shorter amount of time. For example, generally less thermal damage occurs by heating at 800° C. for 5 seconds, than by heating at 700° C. for 10 minutes. Therefore, in selecting operating conditions in methods in accordance with the invention, a reduced heating time at a higher temperature is preferable to a longer heating time at a lower temperature. Heating of an integrated circuit substrate to achieve good crystallization of layered superlattice materials (or other metal oxide) and to minimize thermal damage to the integrated circuit is influenced by a number of variables, including, but not limited to: heating temperature; total heating time at elevated temperature (e.g., 800° C.); thin film thickness; presence of oxygen; and, relative location of diffusion barrier layers. For example, a thin film of layered superlattice material having a thickness less than 100 nanometers (nm) generally requires a lower thermal budget to achieve good electronic properties than a thicker film. In the field of reaction engineering, it is known that the reaction rate is generally proportional to temperature, that is, the reaction rate increases with temperature. Nevertheless, the proportional relationship of reaction rate to temperature is usually not linear. In the art, it is generally held that reaction rate approximately doubles when temperature increases 10° C. Thus, by increasing the temperature of a chemical reaction process by 30° C., for example, the time required for reaction is reduced to a fraction of the time required without temperature increase. Efforts in the prior art to reduce thermal damage to integrated circuit memory capacitors typically aimed to minimize the temperature levels at which a memory circuit was heated. In contrast, methods in accordance with the present invention are designed to minimize the thermal budget of a process, that is, the product of heating time and heating temperature. Because the relation between reaction temperature and reaction rate is not linear, the heating time and thereby the thermal budget of a process are reduced by a relatively large amount through a relatively small increase in heating temperature. As a result, certain embodiments in accordance with the invention conduct heating of an integrated circuit memory substrate at temperatures higher than reported in the prior art, but during a much-reduced heating time.

As used in this specification, the term "thermal budget value" denotes the product of: (elevated processing temperature, expressed in ° C.) multiplied by (time at elevated processing temperature, in seconds). The chemical reaction rates associated with precursor decomposition, compound formation and crystallization processes increase nonlinearly with temperature. A direct comparison of thermal budget values at different temperatures preferably includes multiplying the higher temperature by an adjustment factor greater than 1.0 to compensate for the relative non-linear change in reaction rates corresponding to a change in temperature. For example, if the minimal thermal budget value suitable to yield good results for a given set of operating and product parameters at an elevated temperature of 600° C. is 36,000° C.-sec (i.e., 600° C.×60 sec), then the minimal thermal budget value, without adjustment, suitable for achieving similarly good results at an elevated temperature of 750° C. is typically considerably less than 36,000° C.-sec (i.e., less than 750° C.×48 sec) because the reaction rates are much faster at 750° C. The examples below describe low-thermal-budget fabrication in accordance with the invention of capacitors containing a thin film of layered superlattice material. It is understood, however, that the low thermal budgets described in the examples were not necessarily minimal thermal budgets; that is, it is believed that results as good as achieved with the low thermal budgets of the examples could have been achieved with even lower thermal budgets.

A thin film of layered superlattice material or other metal oxide in accordance with the invention typically has a thickness in a range of from 25 nm to 120 nm. In one aspect, a thin film formed in accordance with the invention has a thickness not exceeding 90 nm. In another aspect, a thin film has a thickness not exceeding 50 nm. In still another aspect, a thin film has a thickness not exceeding 40 nm. In still another aspect, the thin film has a thickness not exceeding 30 nm.

Efforts in the prior art to reduce heating temperature or heating times commonly did not change the thickness of the ferroelectric thin film in a memory capacitor. Decreasing the thickness of the ferroelectric thin film, in accordance with the invention, contributes to reducing the minimal thermal budget of a process, that is, the minimal thermal budget value for achieving good electronic and circuit properties.

An important feature of a method in accordance with the invention is the rapid thermal processing ("RTP") treatment of a chemical precursor coating on an integrated circuit substrate to form crystallized layered superlattice material or other metal oxide. In an RTP technique, the temperature of a thin film containing metal atoms is ramped up to a "hold temperature" at a ramping rate, and held at the hold temperature for a time period, the "holding time". In one aspect, a liquid precursor is deposited on a substrate, dried to form a solid film, and then an RTP is conducted. In another aspect, a precursor coating is deposited on a substrate by MOCVD, and then an RTP is conducted. An RTP operation in accordance with the invention is generally conducted in a conventional rapid thermal processing apparatus. In accordance with the invention, an initial RTP treatment of a substrate is generally at least partially conducted in an oxygen-containing atmosphere to enhance formation of the metal oxide bonds in polycrystalline layered superlattice materials and in other ferroelectric or dielectric compounds. It is contemplated, however, that an oxygen-free unreactive atmosphere may be used for a significant part of the RTP holding time.

In accordance with the invention, the oxidation and crystallization of precursor compounds to form layered superlattice material, or other ferroelectric or dielectric metal oxide material, depends on numerous factors. These factors include: ramping rate, holding time, hold temperature, oxygen-content of the RTP atmosphere, composition of the liquid precursor and the desired metal oxide material, and thickness of a precursor coating and resulting thin film of layered superlattice material. Ferroelectric layered superlattice materials, like the metal oxides $SrBi_2Ta_2O_9$ (SBT) and $SrBi_2(Ta_{1-x}Nb_x)_2O_9$ (SBTN), where $0 \leq x \leq 1$, are particularly useful in nonvolatile memory applications, such as in FeRAMs and nondestructible read-out ferroelectric FETs. Polycrystalline thin films of these layered superlattice materials, as well as other layered superlattice materials, may be fabricated in accordance with the invention. In accordance with the invention, RTP hold temperatures suitable for forming a layered superlattice material are in the range of about from 500° C. to 900° C., preferably from 550° C. to 800° C. For ferroelectric layered superlattice materials such as strontium bismuth tantalate, $SrBi_2Ta_2O_9$, and strontium bismuth tantalate, $SrBi_2(Ta_{1-x}Nb_x)_2O_9$, $0 \leq x \leq 1$, conducting RTP treatments with a nominal ramping rate of 100° C./second and a cumulative holding time in a range of about 2½ minutes (150 seconds) or less at hold temperatures in a range of about from 550° C. to 750° C. results in high remanent polarization, high breakdown voltage, low leakage current and low fatigue. Embodiments in accordance with the invention having a low thermal budget are also useful for providing a thin film of a metal oxide that is not a layered superlattice material, for example, an $ABO_3$-type perovskite, such as barium strontium titanate.

In one aspect of the invention, it is not necessary to conduct any oxygen furnace anneals. Thus, in preferred embodiments in accordance with the invention, RTP treatment is the only heating technique performed at an elevated temperature above about 500° C. to promote reaction and crystallization in the deposited thin film to form the desired polycrystalline layered superlattice material or other metal oxide. Because heating of a ferroelectric or a dielectric metal oxide thin film by RTP is very effective compared with other heating techniques, such as furnace annealing, the thermal budget of a method in accordance with the invention is minimized.

After the RTP has been conducted, the substrate containing the layered superlattice material thin film may optionally be given an oxygen furnace anneal. It is generally believed in the art that an oxygen furnace anneal conducted after an RTP tends to increase the remanent polarization of the layered superlattice material. Nevertheless, in one aspect of the invention, good electric properties and good physical properties of layered superlattice materials are achieved without a furnace anneal in either oxygen or in a nonreactive gas.

In embodiments of the invention in which a liquid precursor is deposited as a liquid coating on a substrate, the RTP is typically preceded by a step of baking the coating on the substrate at a temperature not exceeding 400° C., typically in an oxygen-containing ambient, typically in $O_2$ gas.

In one aspect, a method of fabricating a thin film of layered superlattice material comprises applying a precursor to a substrate to form a coating, and heating the substrate including the coating using rapid thermal processing at a temperature in a range of about from 500° C. to 900° C. for a cumulative heating time not exceeding 30 minutes, the precursor containing metal in effective amounts for forming a layered superlattice material upon heating the precursor. In still another aspect, the cumulative heating time does not exceed 5 minutes.

In one aspect, a low thermal budget method in accordance with the invention is particularly useful in the fabrication of an integrated circuit memory containing a thin film of layered superlattice material. In another aspect, heating the substrate comprises conducting a pre-TE RTP-treatment of the substrate including a coating, and further comprises a step of forming a top electrode layer on the coating after the pre-TE RTP-treatment, wherein heating the substrate further comprises conducting a post-TE RTP-treatment after forming the top electrode. In still another aspect, conducting a post-TE RTP-treatment is done in a nonreactive gas. In another aspect, a method in accordance with the invention further comprises a step of baking the coating on the substrate before heating the substrate. In another aspect, a pre-TE RTP treatment is conducted at a temperature in range of about from 500° to 800° C. for a pre-TE RTP heating time in a range of about from five seconds to 10 minutes. In another aspect, a post-TE RTP treatment is conducted at a temperature in range of about from 500° to 800° C. for a post-TE RTP heating time in a range of about from five seconds to 10 minutes.

In one aspect, a method in accordance with the invention comprises applying a first liquid coating on the substrate, baking the first coating to form a first dried coating, applying a second liquid coating on the first dried coating, and baking the second liquid coating to form the coating. In still another aspect, heating the substrate comprises conducting a pre-TE RTP-treatment of the substrate after baking the second liquid coating, and further comprises a step of forming a top electrode layer on the coating after the pre-TE RTP-treatment, wherein heating the substrate further comprises conducting a post-TE RTP-treatment after forming the top electrode. In still another aspect, a post-TE RTP-treatment is conducted in a nonreactive gas.

In one aspect, applying a precursor and heating the substrate comprises are applying a first liquid coating on the substrate, baking the first coating to form a first dried coating, conducting a first pre-TE RTP-treatment of the substrate after baking the first coating; applying a second liquid coating on the first coating after the first pre-TE RTP-treatment, baking the second liquid coating, and conducting a second pre-TE RTP-treatment of the substrate after baking the second liquid coating. In still another aspect, a method in accordance with the invention further comprises a step of forming a top electrode layer on the coating after the second pre-TE RTP-treatment, and heating the substrate comprises conducting a post-TE RTP-treatment after forming the top electrode layer. In still another aspect, the post-TE RTP-treatment is conducted in a nonreactive gas.

One aspect of the invention is formation of a thin film of layered superlattice material using MOCVD. In a related aspect, a metal organic precursor flows into a CVD reaction chamber to apply a precursor coating on a substrate.

In one aspect, the layered superlattice material comprises strontium bismuth tantalate. In another aspect, a precursor or a combination of precursors includes u mole-equivalents of strontium, v mole-equivalents of bismuth, and w mole-equivalents of tantalum, and $0.7 \leq u \leq 1.0$, $2.0 \leq v \leq 2.3$, and $1.9 \leq w \leq 2.1$. In still another aspect, the layered superlattice material comprises strontium bismuth tantalum niobate. In another aspect, a precursor includes u mole-equivalents of strontium, v mole-equivalents of bismuth, w mole-equivalents of tantalum, and x equivalents of niobium, and $0.7 \leq u \leq 1.0$, $2.0 \leq v \leq 2.3$, $1.9 \leq w \leq 2.1$, $1.9 \leq x \leq 2.1$ and $1.9 \leq (w+x) \leq 2.1$.

In one aspect, a ferroelectric integrated circuit memory cell in accordance with the invention comprises a ferroelectric memory element including a polycrystalline ferroelectric thin film, and an electrode for applying an electric field to the ferroelectric thin film, the ferroelectric thin film having a thickness of 40 nm or less.

In one aspect of the invention, the substrate comprises a first electrode, and the method includes forming a thin film of layered superlattice material on the first electrode, then a second electrode on the thin film of layered superlattice material, after a pre-TE RTP, to form a memory capacitor, and subsequently performing a post-TE RTP operation. In a preferred embodiment, the first electrode and the second electrode contain platinum and titanium. The post-RTP is typically conducted at a temperature in the range of from 500° C. to 900° C., preferably 550° C. to 800° C., preferably for duration of 5 seconds to 5 minutes. In one aspect of the invention, the post-TE RTP-treatment is conducted in an oxygen-containing ambient, typically in $O_2$ gas. In another aspect, post-TE RTP-treatment is conducted in a nonreactive ambient, typically in $N_2$ gas. Preferably, an electrically conductive barrier layer is formed on the substrate prior to applying the precursor coating.

In one aspect, a method in accordance with the invention has a thermal budget value in a range of about from 2,500° C.-sec to 960,000° C.-sec, preferably less than 50,000° C.-sec.

Numerous other features, objects and advantages of the invention will become apparent from the following description when read in conjunction with the accompanying drawings.

DETAILED DESCRIPTION OF THE INVENTION

Embodiments in accordance with the invention are described herein with reference to FIGS. 1–13.

Figure 1:
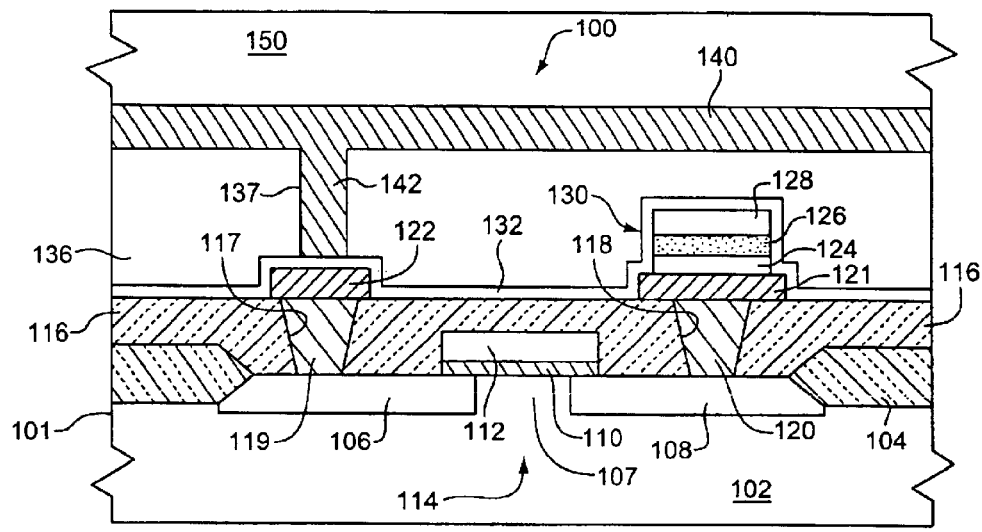
FIG. 1 is a schematic of a cross-sectional view of a portion of an integrated circuit as may be fabricated by the method of the invention showing a nonvolatile ferroelectric memory cell in which the capacitor is located above the switch.
Figure 2:
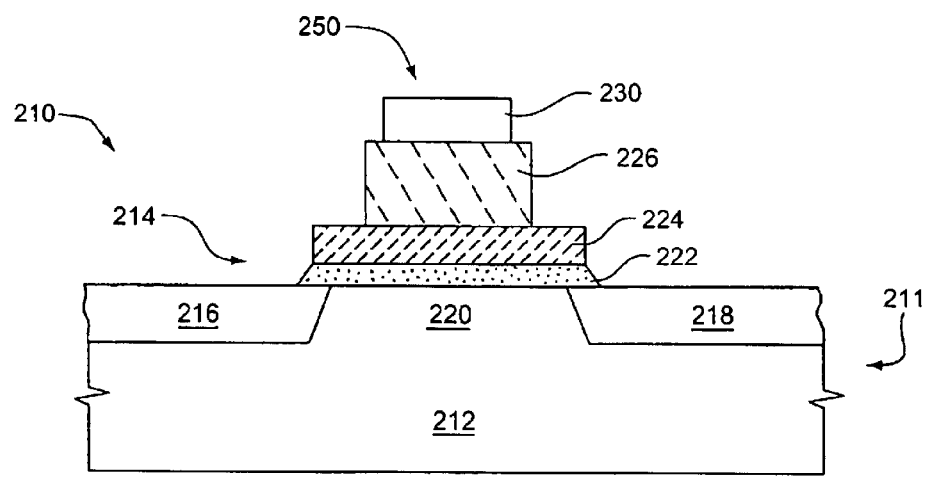
FIG. 2 shows a cross-sectional view of a portion of a ferroelectric FET memory that may be fabricated using a method in accordance with the invention.

It should be understood that FIGS. 1 and 2, depicting integrated circuit devices, are not meant to be actual plan or cross-sectional views of any particular portion of actual integrated circuit devices. In actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric and dielectric devices that could be fabricated using the method of the invention. For example, FIG. 1 depicts a portion of a ferroelectric memory 100 containing a switch in the form of a field effect transistor 114 in electrical connection with a ferroelectric capacitor 130. Although the ferroelectric element 126 depicted in FIG. 1 is substantially above switch element 114, the invention is also useful, for example, to fabricate a thin film of layered superlattice material in a memory cell or other integrated circuit device disposed in a sideways or vertical orientation with respect to the horizontal plane of FIG. 1. In addition, a method in accordance with the invention may also be used to fabricate a ferroelectric FET memory in which the ferroelectric element comprising layered superlattice material is incorporated in the switch element. Such a ferroelectric FET, as depicted in FIG. 2, was described in U.S. Pat. No. 5,523,964 issued Jun. 4, 1996 to McMillan et al. and U.S. patent application Ser. No. 09/365, 628 filed Aug. 2, 1999.

FIG. 1 shows a cross-sectional view of an exemplary nonvolatile ferroelectric memory 100 fabricated in accordance with the invention. The general manufacturing steps for fabricating integrated circuits containing MOSFETs and ferroelectric capacitor elements are described in U.S. Pat. No. 5,466,629, issued Nov. 14, 1995 to Mihara et al., and U.S. Pat. No. 5,468,684, issued Nov. 21, 1995 to Yoshimori et al. General fabrication methods have been described in other references also, and are well known in the art. Therefore, the elements of the circuit of FIG. 1 will be simply identified here.

FIG. 1 shows a ferroelectric random access memory cell 100. Memory cell 100 includes a transistor switch 114 and a capacitor 130 formed on a semiconductor wafer 101. In the embodiment shown, transistor 114 is a MOSFET and includes source region 106, drain region 108, a channel region 107, gate insulating layer 110 and gate electrode 112. Capacitor 130 includes bottom electrode 124, ferroelectric layer 126, and top electrode 128. A field oxide region 104 is formed on a surface of a silicon substrate 102. Source region 106 and drain region 108 are formed separately from each other within silicon substrate 102. A gate insulating layer 110 is formed on silicon substrate 102 between the source and drain regions 106 and 108. Further, a gate electrode 112 is formed on gate insulating layer 110.

A first interlayer dielectric layer (ILD) 116 made of BPSG (boron-doped phospho-silicate glass) is formed on substrate 102 and field oxide region 104. ILD 116 is patterned to form vias 117, 118 to source region 106 and drain region 108, respectively. Vias 117, 118 are filled to form plugs 119, 120, respectively. Plugs 119, 120 are electrically conductive and typically comprise tungsten or polycrystalline silicon. Diffusion barrier material is deposited and patterned on ILD 116 to form diffusion barriers 121, 122 in electrical contact with plugs 119, 120, respectively. Diffusion barriers 121, 122 are made of, for example, titanium nitride, and typically have a thickness of 10 nm to 20 nm. Diffusion barrier layers, such as titanium nitride, inhibit the diffusion of chemical species between the underlying and overlying layers of memory 100.

As depicted in FIG. 1, a bottom electrode layer 124 made of platinum and having a thickness of 100 nm is deposited on diffusion barrier layer 121. Then a ferroelectric thin film 126 of layered superlattice material is formed in accordance with the invention on bottom electrode layer 124. A top electrode layer 128, made of platinum and having a thickness of 100 nm, is formed on ferroelectric thin film 126.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits. Hydrogen barrier layer 132 is formed above ferroelectric capacitor 130 and MOSFET 114, to cover the surface area above memory cell 100. The composition, fabrication and etching of hydrogen barriers are known in the art. See, for example, U.S. Pat. No. 6,225,565 B1 issued May 1, 2001 to Cuchiaro et al., and U.S. Pat. No. 6,180,971 issued Jan. 30, 2001 to Maejima, which are hereby incorporated by reference.

A second interlayer dielectric layer (ILD) 136 made of NSG (nondoped silicate glass) is deposited to cover ILD 116, diffusion barrier layer 121, and ferroelectric capacitor 130. A doped silicate glass, such as FSG (fluorosilicate glass), PSG (phospho-silicate glass) film or a BPSG (boron phospho-silicate glass) film could also be used in layer 136. ILD 136 is patterned to form a via 137 through barrier 132 to plug 119. A metallized wiring film 140 is deposited to cover ILD 136 and fill via 137 and then patterned to form plug 137 and source electrode wiring 142. Top electrode wiring (not shown in cross-section) makes electrical connection to top plate-electrode 128. Wirings 140, 142 preferably comprise Al—Si—Cu standard interconnect metal with a thickness of about 200 nm to 300 nm. Typically, a film of adhesion material (not shown), for example, comprising Ti and TiN, is deposited on the substrate and wiring film 140 is then formed on the adhesion film. Dielectric layer 150 covers wiring film 140 and ILD 136.

FIG. 2 shows a cross-sectional view of a portion of a ferroelectric FET memory 210 as may be fabricated using a method in accordance with an embodiment of the invention. Memory 210 comprises a ferroelectric FET 250 formed on a wafer 211, comprising a standard semiconductor material 212, preferably a p-100 silicon material. A semiconductor substrate 214 comprises a highly doped source region 216 and a highly doped drain region 218, which are formed about a doped channel region 220. Doped source region 216, drain region 218 and channel region 220 are preferably n-type doped regions, but also may be p-type regions formed in an n-type semiconductor. Semiconductor substrate 214 typically also includes a gate oxide 222 usually located above channel region 220, but which can extend beyond channel region 220 to cover parts of source region 216, drain region 218 and other parts of semiconductor material 212. Typically, gate oxide 222 is formed from semiconductor material 212 during high temperature process steps. When semiconductor material 212 is silicon, then gate oxide 222 usually comprises silicon dioxide. An interface insulator layer 224 may be formed above semiconductor substrate 214 above channel 220, usually on gate oxide 222. A ferroelectric thin film 226, formed in accordance with the invention, is located above interface insulator layer 224 and channel region 218, usually on interface insulator layer 224. Gate electrode 230 is formed above ferroelectric thin film 226, usually on ferroelectric thin film 226.

U.S. Pat. No. 5,519,234 issued May 21, 1996 to Paz de Araujo et al. discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995 to Watanabe et al. and U.S. Pat. No. 5,468,684 issued Nov. 21, 1995 to Yoshimori et al. describe processes for integrating these materials into practical integrated circuits.

The layered superlattice materials may be summarized generally under the formula:

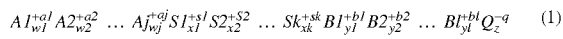

$$A1^{+a1}_{w1} A2^{+a2}_{w2} \ldots Aj^{+aj}_{wj} S1^{+s1}_{x1} S2^{+s2}_{x2} \ldots Sk^{+sk}_{xk} B1^{+b1}_{y1} B2^{+b2}_{y2} \ldots Bl^{+bl}_{yl} Q^{-q}_{z} \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U.S. Pat. No. 5,519,234 issued May 21, 1996 to Paz de Araujo et al., referenced above. The layered superlattice materials do not include every material that can be fit into Formula (1), but only those which form crystalline structures with distinct alternating layers upon heating.

U.S. Pat. No. 5,803,961 issued Sep. 8, 1998 to Azuma et al. discloses that mixed layered superlattice materials, such as strontium bismuth tantalum niobate, can have even more improved properties in ferroelectric applications. The mixed layered superlattice materials are typically characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.7 \leq a \leq 1$, $2 \leq b \leq 2.2$, $0 \leq x \leq 0.3$ and $1.9 \leq c \leq 2.1$ (SBTN), are being used and are under further development for use as a capacitor dielectric in nonvolatile memory applications, such as in FeRAMs and nondestructible read-out ferroelectric FETs. Polycrystalline thin films of these layered superlattice materials, as well as other layered superlattice materials represented by Formula (1), may be fabricated and used in accordance with the invention.

Methods in accordance with the present invention are also generally useful for fabrication of integrated circuits containing metal oxide thin films, including but not limited to, $ABO_3$-type perovskite metal oxides. In the general formula $ABO_3$, A and B are cations and O is the anion oxygen. The term is intended to include materials where A and B represent multiple elements; for example, it includes materials of the form $A'A''BO_3$, $AB'B''O_3$, and $A'A''B'B''O_3$, where A', A'', B' and B'' are different metal elements. Preferably, A, A', A'', are metals selected from the group of metals consisting of Ba, Bi, Sr, Pb, Ca, and La, and B, B', and B'' are metals selected from the group consisting of Ti, Zr, Ta, Mo, W, and Nb. A, A', and A'' are collectively referred to herein as A-site materials. B, B', and B'' are collectively referred to herein as B-site materials. Some perovskite metal oxides, such as PZT and PLZT, are classified as ferroelectrics, though some may not exhibit ferroelectricity at room temperature. Others do not exhibit ferroelectric properties, but have high dielectric constants and are useful in high dielectric constant capacitors. For example, barium strontium titanate ("BST") and other $ABO_3$-type perovskite metal oxides, are used as capacitor dielectric in DRAMs. Preferably, BST is fabricated in accordance with the invention by blending excess A-site and B-site materials in a BST-precursor solution, as described in U.S. Pat. No. 6,025,619, issued Feb. 15, 2000, to Azuma et al., which is hereby incorporated by reference. The excess A-site and B-site materials increase the dielectric constant of the dielectric layer of the capacitor with little or no effect on leakage current. These BST solutions are typically prepared by reacting barium with 2-methoxyethanol and 2-ethylhexanoic acid, adding strontium, allowing the mixture to cool, and adding titanium isopropoxide and 2-methoxyethanol.

An RTP operation in accordance with the invention is generally conducted in a conventional rapid thermal processing apparatus. In accordance with the invention, an initial RTP operation is generally at least partially conducted in an oxygen-containing atmosphere to enhance formation of the metal oxide bonds in polycrystalline layered superlattice materials and other ferroelectric or dielectric compounds. It is contemplated, however, that an oxygen-free unreactive atmosphere may be used for a significant part of the holding time.

A method in accordance with the invention includes rapidly ramping the temperature in the oven of an RTP apparatus up to the hold temperature. It is contemplated, however, that a plurality of hold temperatures may be used. As a result of the RTP, the annealing of the layered superlattice material, or other dielectric or ferroelectric metal oxide, occurs substantially at the hold temperature, rather than the lower temperature region. That is, it is believed that by using RTP, the crystallization process proceeds directly into the high temperature crystalline phase, thus reducing or eliminating altogether the generation of the low temperature crystalline phases, which are referred to in the art as the "fluorite phases". The actual ramping rate is typically in the range of from 10° C. to 150° C. per second, preferably about 100° C. per second. The term "ramp rate" applies to the rate of temperature increase experienced in the integrated circuit substrate. Typically, the hold temperature is the maximum temperature reached during the RTP. After annealing at the RTP hold temperature, the substrate may be cooled using conventional cooling techniques.

The word "substrate" can mean the underlying semiconductor material 102, 212 on which the integrated circuit is formed, as well as any object on which a thin film layer is deposited. In this disclosure, "substrate" shall generally mean the object to which the layer of interest is applied. For example, when we are talking about a ferroelectric thin film 126 of FIG. 1, the substrate on which it is initially deposited may include various elements, in particular, bottom electrode 124.

The long horizontal dimensions of substrates 102, 212 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction. Terms of orientation herein, such as "above", "top", "upper", "below", "bottom" and "lower", mean relative to substrate 102, 214. That is, if a second element is "above" a first element, it means it is farther from semiconductor substrate 102, 212; and if it is "below" another element, then it is closer to semiconductor substrate 102, 214 than the other element. Terms such as "above" and "below" do not, by themselves, signify direct contact. However, terms such as "on" or "onto" do signify direct contact of one layer with an underlying layer. It is understood that thin films of layered superlattice material fabricated in accordance with the invention have various shapes and conform to various topographies and features of an integrated circuit substrate. Accordingly, thin films of layered superlattice material in accordance with the invention are formed on planar substrates, in trenches and vias, on vertical sidewalls, and in other various nonhorizontal and three-dimensional shapes.

The term "thin film" is used herein as it is used in the integrated circuit art. Generally, it means a film of less than a micron in thickness. The thin films disclosed herein are typically less than 500 nm in thickness. A thin film of layered superlattice material fabricated by a method in accordance with the invention typically has a final thickness in a range of about from 20 nm to 300 nm, preferably in a range of about from 25 nm to 150 nm. The thin films having a thickness of about 50 nm or less are specifically designated "ultra-thin films" in this specification. These thin films and ultra-thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metal atoms in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The word "precursor" used herein can mean a solution containing one metal organic solute that is mixed with other precursors to form intermediate precursors or final precursors, or it may refer to a final liquid precursor solution or gas mixture, that is, the precursor to be applied to a particular surface during fabrication. The precursor as applied to the substrate is usually referred to as the "final precursor", "precursor mixture", or simply "precursor". In any case, the meaning is clear from the context.

A "precursor compound" in this disclosure refers to a metal organic compound containing at least one metal that is included in the desired layered superlattice material of the thin film formed in accordance with the invention. The metal organic precursor compounds disclosed herein are useful because they can be easily dissolved in organic liquid precursor solutions, which can be stored until used. In a liquid-source misted chemical deposition ("LSMCD") method in accordance with the invention, one or more liquid precursor solutions are atomized to form a mist that contains precursor compounds suitable for formation of the desired thin film. See, for example, U.S. Pat. No. 6,326,315 B1 issued Dec. 4, 2001 to Uchiyama et al., and U.S. Pat. No. 6,258,733 B1 issued Jul. 10, 2001 to Solayappan et al., which are hereby incorporated by reference. In embodiments in accordance with the invention utilizing a metal-organic chemical vapor deposition ("MOCVD") technique to deposit a precursor coating on a substrate, typically one or more liquid precursor streams are vaporized, and then one or more gaseous precursor compounds flow into a CVD reaction chamber, in which a solid coating containing desired metal compounds forms on a wafer substrate. See, for example, U.S. Pat. No. 6,110,531, issued Aug. 29, 2000 to Paz de Araujo et al., which is hereby incorporated by reference. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art.

Thin film layers formed in accordance with the invention have smooth, continuous and uniform surfaces, even when not planar, and they can be reliably fabricated to have thicknesses in the range of from 25 nm to 300 nm, maintaining important structural and electrical characteristics. The reduced heating time at elevated temperature of a low-thermal-budget technique reduces the formation of hillocks and other non-uniformities at the surfaces of deposited layers. The resulting enhanced smoothness improves interfacial contacts and inhibits electrical shorting.

It should be understood that the specific processes and electronic devices described herein are exemplary; that is, the invention contemplates that the layers in FIGS. 1 and 2 may be made of many other materials than those mentioned above and described below. There are many other variations of the method of the invention than can be included in a document such as this, and the method and materials may be used in many other electronic devices other than integrated circuit devices 100 and 210.

In general, some form of heating or annealing of a deposited metal-containing film in oxygen at elevated temperature is necessary for desired formation and crystallization of the desired metal oxide material, in particular for crystallization of layered superlattice material. An important feature of embodiments of the invention is that the total heating times at elevated temperature are minimized compared to the prior art. In certain embodiments described in detail in this specification, RTP treatments are conducted in oxygen-containing gas. In other embodiments described herein, however, RTP is conducted in an oxygen-containing gas for part of the total thermal-budget time, followed by annealing in an unreactive gas. The term "elevated temperature" as used herein generally refers to a temperature in a range of about from 500° C. to 900° C., typically in excess of about 550° C. The term "gas" is used in its broader sense of being either a pure gas or a mixture of several gases. The term "oxygen-containing" means that the relative amount of oxygen present is not less than one mole-percent. It is believed that heating at about 500° C. or higher is necessary to achieve the activation energies associated with crystallization of layered superlattice material.

Terms such as "heating", "drying", "baking", "rapid thermal process" ("RTP"), "furnace anneal" ("FA"), and others all involve the application of heat. For the sake of clarity, the various terms are used in the art to distinguish certain techniques and method steps from one another. In this specification, the terms "drying" and "baking" are used practically synonymously. The terms "heat", "heating", and related terms generally designate heating processes conducted in a temperature range of about from 500° C. to 900° C., and include RTP and furnace-annealing techniques. A rapid thermal processing, RTP, technique in accordance with the invention is distinct from other heating techniques in being characterized by a very rapid rise in ambient temperature and in the temperature of the heated object, typically at an actual ramp rate of 10° C. to 200° C. per second. It is further understood that one skilled in the art may accomplish a desired process result using a baking, heating, or RTP-heating technique as disclosed herein, while referring to the technique with a term different from the one used herein.

A method in accordance with the invention for fabricating integrated circuit memories generally includes at least one RTP-heating of a coating of ferroelectric precursor compounds before deposition of a top-electrode layer on the ferroelectric layer, and generally further includes at least one RTP-heating of the ferroelectric layer after deposition of the top-electrode layer. In this specification, an RTP treatment before deposition of a top-electrode layer is referred to as a "pre-top-electrode" RTP, or a "pre-TE" RTP. Similarly, an RTP treatment after deposition of a top-electrode layer is referred to as a post-top-electrode RTP, or a "post-TE" RTP. In this specification, when reference is made to heating "using rapid thermal processing", it is understood that RTP is included, but that the heating is not necessarily exclusively by RTP.

The terms "liquid coating", "precursor coating", "coating" and similar terms in this specification generally designate a liquid or solid coating containing metal atoms in stoichiometric amounts for forming metal-oxide ferroelectric layered superlattice material upon heating in accordance with the invention. In certain embodiments, particularly in embodiments utilizing a liquid deposition technique, a liquid coating initially possesses essentially the same chemical composition as the precursor solutions deposited on the substrate. During drying and heating steps, the chemical composition and state of a liquid coating change. In this specification, such a deposited coating is generally denoted as a precursor coating, an "FE coating" or simply a "coating". Similarly, in embodiments utilizing an MOCVD technique, a coating as deposited on a substrate in the CVD reaction chamber typically has a chemical composition different from the chemical composition of the initial gaseous precursor streams entering the reaction chamber. Such a deposited coating is also generally denoted as a "precursor coating", an "FE coating" or a coating.

After initial deposition on a substrate, a coating containing metal atoms in stoichiometric amounts for forming layered superlattice material achieves desired ferroelectric and other electronic properties only during the course of subsequent fabrication processes in accordance with the invention. For clarity and identification purposes in this specification, the terms "coating", "precursor coating", "FE coating", "FE" and similar terms are used broadly to refer to the layer of metal-containing material disposed on an integrated circuit substrate, typically on a bottom electrode layer, that is treated in accordance with the invention to form a thin film of ferroelectric layered superlattice material. The terms "ferroelectric film", "ferroelectric thin film", "ferroelectric layer" and similar terms in this specification generally refer to the element resulting from heat treatment of a metal-containing coating in accordance with the invention, such as pre-TE RTP and post-TE RTP. The use in this specification of the terms "FE coating" and related terms, on the one hand, and of the terms "ferroelectric thin film" and related terms, on the other hand, overlap somewhat; nevertheless, their meaning is clear from the context in which they are used.

Individual precursor compounds of a precursor solution for fabricating a layered superlattice material thin film may be selected from the group including metal beta-diketonates, metal polyalkoxides, metal dipivaloylmethanates, metal cyclopentadienyls, metal alkoxycarboxylates, metal carboxylates, metal alkoxides, metal ethylhexanoates, octanoates, and neodecanoates. An individual metal organic decomposition ("MOD") precursor compound is formed, for example, by interacting each metal of a desired compound, for example, strontium, bismuth, tantalum or niobium, or an alkoxide of the metal, with a carboxylic acid, or with a carboxylic acid and an alcohol, and dissolving the reaction product in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, and 2-pentanol. Solvents that may be used include xylenes, n-octane, n-butyl acetate, n-dimethylformamide, 2-methoxyethyl acetate, methyl isobutyl ketone, and methyl isoamyl ketone, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution. For example, a precursor comprising a metal 2-ethylhexanoate compound is well suited for use in a liquid deposition technique, such as a liquid spin-on technique or a liquid-source misted chemical deposition ("LSMCD") technique. A metal 2-ethylhexanoate is well suited for use in a liquid deposition technique because the ethylhexanoates are stable in solution, have a long shelf life, form smooth liquid films, and decompose smoothly on a substrate. The ethoxyhexanoates and other metalorganic precursor compounds may be stored for periods of several months when dissolved in xylenes or n-octane.

Figure 3:
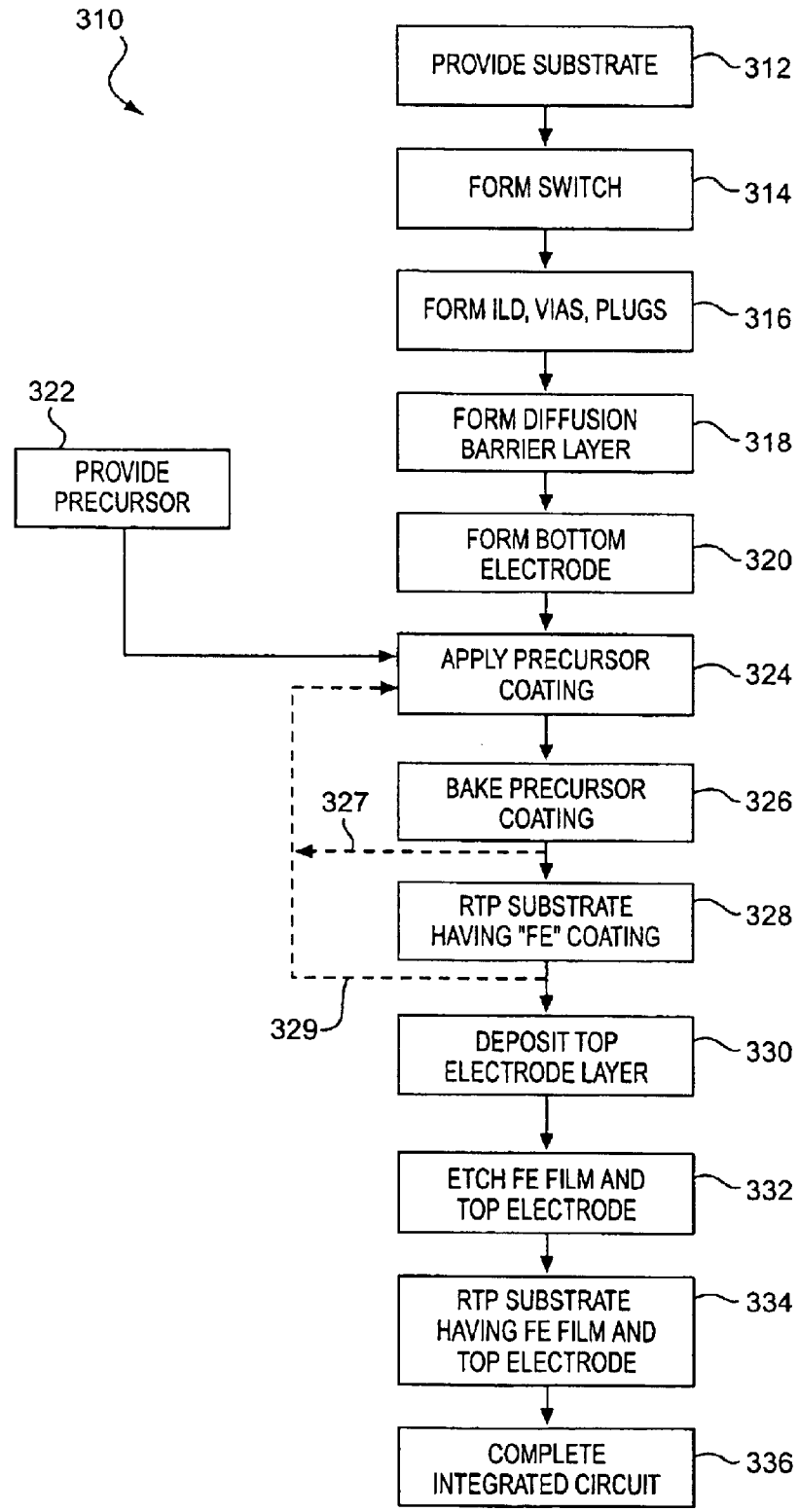
FIG. 3 is a generalized flow chart of a method utilizing a liquid-deposition technique in accordance with the invention for fabricating a ferroelectric memory containing a thin film of layered superlattice material.

The diagram of FIG. 3 is a flow sheet of fabrication processes of a generalized LTB method 310 in accordance with the invention utilizing a liquid-deposition technique to make a ferroelectric memory, as depicted in FIG. 1, containing layered superlattice material. Although method 310 of FIG. 3 is discussed herein with reference to FIG. 1, it is clear that the method of FIG. 3 and numerous variations of the method in accordance with the invention may be used to fabricate thin films of polycrystalline layered superlattice materials of other compositions in various types of ferroelectric structures of the integrated circuit art, and generally to fabricate metal oxide thin films in integrated circuits.

In processes 312, a semiconductor substrate is provided on which a switch is formed in processes 314. The switch is typically a MOSFET. In processes 316, an insulating layer is formed by conventional techniques to separate the switching element from the ferroelectric element to be formed. Using conventional processes, the insulating layer is patterned to form vias, which are filled with conductive plugs to electrically connect the switch to the memory capacitor and the rest of the integrated circuit. In processes 318, a diffusion barrier layer is deposited on the insulating layer and patterned. Preferably, the diffusion barrier comprises titanium nitride and has a thickness of about 10 nm to 20 nm. Preferably, the diffusion barrier is deposited by a conventional sputtering method, using a titanium nitride target, although a titanium target with a nitrogen-containing sputter gas may also be used. In processes 320, a bottom electrode is formed. Preferably, the electrode is made of platinum and aluminum and is sputter-deposited to form a layer with a thickness in a range of about 100 nm to 200 nm. In processes 322, chemical precursors of the layered superlattice material that will form the desired ferroelectric thin film are prepared. Usually, precursor solutions are prepared from commercially available solutions containing the chemical precursor compounds. If necessary, the concentrations of the various precursors-supplied in the commercial solutions are adjusted in processes 322 to accommodate particular manufacturing or operating conditions. Preferred embodiments of a method in accordance with the invention utilize a final liquid precursor solution containing relative molar proportions of the elements strontium, bismuth, tantalum and niobium corresponding approximately to $SrBi_2Ta_2O_9$ (SBT) and $Sr_aBi_b(Ta_{1-x}Nb_x)_cO_{[9+(a-1)+(b-2)(1.5)+(c-2)(2.5)]}$ (SBTN), where $0.7 \leq a \leq 1$, $2 \leq b \leq 2.2$, $0 \leq x \leq 0.3$ and $1.9 \leq c \leq 2.1$. A liquid coating of precursor solution is applied to the substrate in processes 324. The precursor for forming the ferroelectric thin film of layered superlattice material is applied as a coating on the bottom electrode in processes 324. In accordance with the invention, the precursor may be applied using a conventional liquid deposition technique, such as a misted deposition method as described in U.S. Pat. No. 6,326,315 B1 issued Dec. 4, 2001 to Uchiyama et al., and U.S. Pat. No. 6,258,733 B1 issued Jul. 10, 2001 to Grant et al., or a spin-coating method. In a liquid-source misted chemical deposition ("LSMCD") method in accordance with the invention, one or more liquid precursor solutions are atomized to form a mist that contains precursor compounds suitable for formation of the desired thin film. In some of the examples below, the precursor solution was applied using liquid spin-coating techniques. Depending on the liquid coating method used (for example, spin-on coating or misted deposition) and desired film thickness, among other factors, the concentration of a final liquid precursor coating applied to a substrate is typically in a range of about from 0.02 moles to 0.4 moles per liter. For example, a single spin-on coating of about 1 ml of 0.06 molar solution spun at 2500 rpm for 2 minutes to 3 minutes is suitable for forming an SBT film having a thickness of about 25 nm. In contrast, two spin-on coatings of about 1 ml of 0.1 molar solution spun at about 2500 rpm for 2 minutes to 3 minutes are suitable for forming an SBT film having a thickness of about 120 nm. In drying processes 326, the substrate with the coating of liquid precursor is baked and dried at a temperature not exceeding 300° C. Preferably, the drying processes are conducted on a hot plate in substantially pure $O_2$ gas, or at least in an oxygen-containing gas, for a time period not exceeding 15 minutes. Preferably, drying of each layer is conducted in two substeps. For example, in a first substep, the liquid coating is dried by baking the substrate at about 160° C. for about one minute, and in the second substep, the substrate is baked at about 260° C. for about four minutes.

When only a single coating is applied to a substrate, integrated circuit fabrication continues after drying/baking processes 326 and proceeds to RTP processes 328. When a plurality of liquid coatings are applied in sequence to form a thin film of layered superlattice material, then either an RTP treatment of the substrate is conducted in processes 328, or another liquid coating is applied to the substrate on the previously dried coating. Dashed flow line 327 in FIG. 3 indicates an alternative flow path of an embodiment comprising application of a plurality of liquid layers. Different variations of process flow are suitable in a method in accordance with the invention. For example, in certain embodiments, a first liquid coating is applied and baked, and a second liquid coating is applied and baked, then an RTP treatment is conducted in processes 328, and then a third liquid coating is applied and baked, and the substrate is treated a second time using RTP.

In other embodiments comprising application of a plurality of liquid layers in accordance with the invention, process flow proceeds from baking processes 326 to RTP processes 328 after application of each coating, and then returns to processes 324, as indicated by dashed flow line 329. In still other embodiments involving liquid misted deposition of a liquid coating, deposition of liquid coating is interrupted one or more times so that the partial coating is dried/baked before more liquid is applied, or the partial coating is dried/baked and RTP-treated before more liquid is applied by misted deposition.

RTP treatment in processes 328 is conducted at a temperature in a range of about from 500° C. to 900° C., for a time period in the range of about from 5 seconds to 10 minutes. Preferably, the RTP is conducted at a temperature of from 550° C. to 700° C. for about 5 seconds to 30 seconds with an actual ramping rate in a range of from 10° C. to 200° C. per second, preferably about 100° C. per second. Radiation from a halogen lamp, an infrared lamp, or an ultraviolet lamp provides the source of heat for the RTP step. In the examples below, an AG Associates Model 410 Heat Pulser utilizing a halogen source at ambient atmospheric pressure was used. The RTP is performed in an oxygen-containing gas, preferably in substantially pure $O_2$ gas, for at least part of the total holding time. An RTP treatment conducted in processes 328 is referred to as a pre-TE RTP. It is,believed that pre-TE RTP serves to vaporize and to burn off residual organics from the FE coating. At the same time, it is believed that the rapid temperature rise of the RTP promotes nucleation, that is, the generation of numerous crystalline grains of layered superlattice material in the dried precursor, or FE, coating. These grains act as nuclei upon which further crystallization can occur. The presence of oxygen in a pre-TE RTP treatment enhances formation of these grains.

In one aspect, a method in accordance with the invention does not include a furnace anneal of the substrate. Nevertheless, an optional furnace anneal, as known in the art, may be conducted after RTP processes 328. A furnace anneal after processes 328, and before processes 330, is typically conducted at a temperature in a range of from 500° C. to 800° C. An optional furnace anneal is performed either in an oxygen-containing gas, or preferably in an unreactive gas. When a furnace anneal is conducted, furnace-annealing time does not exceed 30 minutes; typically, a furnace anneal is conducted for 30 minutes in a temperature range of about from 600° C. to 750° C.

A top electrode layer having a thickness of about 100 to 200 nm is deposited in processes 330. Preferably, the electrode is formed by RF sputtering of a platinum single layer, but it also may be formed by DC sputtering, ion beam sputtering, vacuum deposition, or other appropriate conventional deposition process. If desirable for the electronic device design, before the metal deposition, the ferroelectric layered superlattice material may be patterned using conventional photolithography and etching, and the top electrode is then patterned in a second process after deposition. In preferred embodiments, as indicated in FIG. 3, and in the examples described below, the top electrode layer and the FE coating are patterned and etched together in processes 332 using conventional photolithography techniques and ion beam milling.

In processes 334, a post-top-electrode ("post-TE") RTP treatment of the substrate is conducted. The post-TE RTP in processes 334 is typically performed at a temperature in a range of from 500° C. to 900° C. for time duration in a range of about from 5 seconds to 30 minutes, preferably in a range of about from 550° C. to 800° C. for less than 5 minutes, and most preferably in a range of about from 5 to 30 seconds. Conducting a post-TE RTP in processes 334 in an unreactive gas, such as helium, argon, and nitrogen, achieves substantially the same result as when conducted in oxygen. Conducting a post-TE RTP in a nonreactive gas decreases exposure of the integrated circuit to oxygen at elevated temperature. In certain embodiments, it is preferable to conduct post-TE RTP treatment, as in processes 334, prior to etching the top electrode layer.

It is believed that the solid precursor coating, or FE coating, disposed on a substrate after pre-TE RTP treatment in oxygen in one or in a sequence of processes 328 comprises oxidized amorphous material that is not yet sufficiently crystallized to ferroelectric layered superlattice material. It is further believed that post-TE RTP treatment in processes 334 serves to complete crystallization of the thin film of layered superlattice material. It is further believed that post-TE RTP treatment in processes 334 serves to release internal stress present in the top electrode and in the interface between the electrode and the ferroelectric thin film. The effect is the same whether the post-TE RTP is performed before or after the patterning processes mentioned in connection with processes 336 below. The circuit is generally completed in processes 336, which can include a number of processes; for example, deposition of an ILD, patterning and milling, and deposition of wiring layers.

Figure 4:
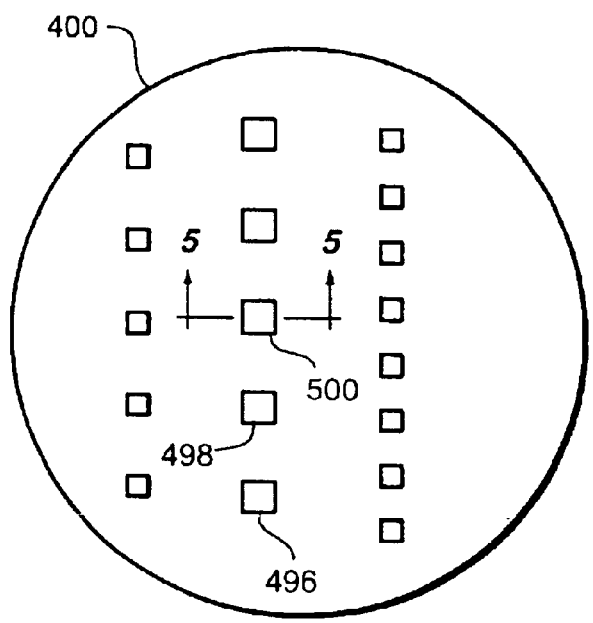
FIG. 4 is a top view of an exemplary wafer on which thin film capacitors fabricated in accordance with the invention are shown greatly enlarged.
Figure 5:
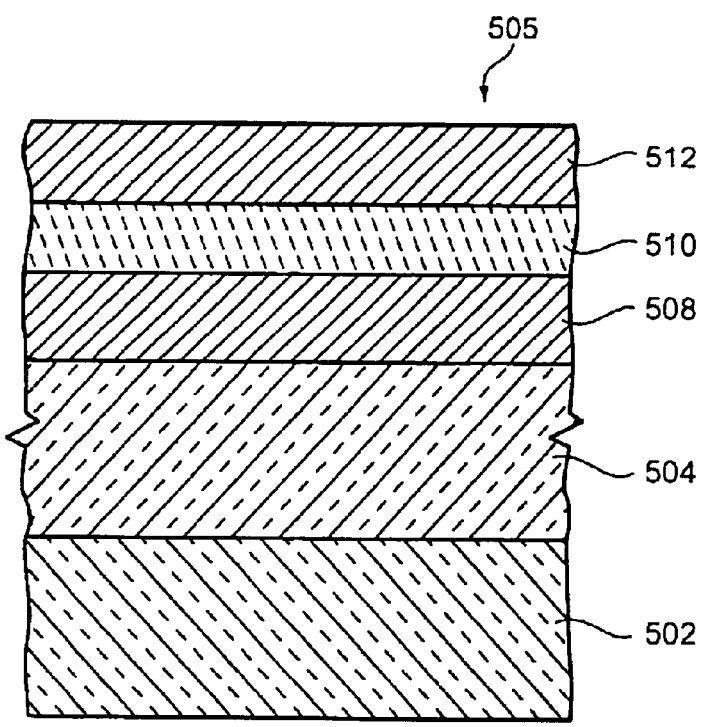
FIG. 5 is a portion of a cross-section of FIG. 4 taken through the lines 5—5, illustrating an exemplary thin film capacitor fabricated in accordance with the invention.

FIG. 4 is a top view of an exemplary wafer 400 on which thin film capacitors 496, 498 and 500 fabricated on substrate 410 in accordance with the invention are shown greatly enlarged. FIG. 5 is a portion of a cross-section 505 of FIG. 4 taken through the lines 5—5, illustrating thin film capacitor 500 fabricated in accordance with the invention. Section 505 includes a silicon dioxide layer 504 formed on a silicon crystal substrate 502. Bottom electrode 508 made of platinum then is sputter-deposited on layer 504. Layer 510 represents a ferroelectric thin film made in accordance with the invention, and layer 512 represents a top electrode made of platinum.

In the examples presented herein, ferroelectric thin film capacitors were fabricated in accordance with the invention on semiconductor wafers, as depicted schematically in FIGS. 4 and 5. Electronic properties of representative capacitors were measured using standard techniques. In selecting a representative capacitorfor a measurement of a particular electronic property, at least three capacitors in each of four quadrants of a wafer were measured to confirm substantially uniform values of the electronic property among the wafers, and then the electronic property of one of the wafers was measured and recorded and presented herein.

EXAMPLE 1

Ultra-thin ferroelectric thin film capacitors, as depicted in FIGS. 4 and 5, containing a thin film of strontium bismuth tantalate layered superlattice material having a thickness of approximately 25 nm, were fabricated using a low thermal budget in accordance with the invention. Electronic and ferroelectric properties, including remanent polarization, coercive field, leakage current, and fatigue characteristics of representative capacitors were measured.

Each of a series of P-type 100 Si wafer substrates 502 was oxidized to form a layer of silicon dioxide 504. The substrate was dehydrated in a vacuum oven at 180° C. for 30 minutes. A bottom platinum electrode 508 layer having a thickness of 200 nm then was sputter-deposited on the substrate, using an argon atmosphere, 8 mTorr pressure and 0.53 amps. On each wafer, the bottom electrode layer was pre-annealed at 650° C. for 30 minutes in $O_2$ gas flowing at 6 l/m, using 10 minute push-pull. A dehydration bake was conducted in a vacuum oven at 180° C. for 30 minutes.

SBT thin films were fabricated using a strontium bismuth tantalate (SBT) liquid precursor solution purchased from the Kojundo Chemical Corporation. The solution contained amounts of metal compounds corresponding to the stoichiometric formula $Sr_{0.9}Bi_{2.2}Ta_2O_9$. The 0.2 mol/l precursor solution contained: bismuth 2-ethylhexanoate, strontium 2-ethylhexanoate, and tantalum 2-ethylhexanoate in n-octane. The 0.2 molar solution was diluted with n-butyl acetate to 0.06 molar final precursor solution immediately before use.

On each wafer, a liquid coating of the precursor was deposited by spin-coating approximately 0.75 ml of 0.06 molar solution of the SBT-precursor on bottom electrode layer 508 at 2500 rpm for 30 seconds. This was dried by baking on a hot plate in $O_2$ gas for one minute at 160° C., followed by four minutes at 260° C. The substrate then was pre-TE RTP-treated in accordance with the invention at 650° C. for 30 seconds in $O_2$ gas, with a ramping rate of 100° C. per second. Thus, the contribution of the pre-TE RTP to the thermal budget was 19,500° C.-sec. The resulting thin film of SBT precursor material had a thickness of about 25 nm. Next, platinum was sputter-deposited on the SBT thin film to make a top electrode layer 512 having a thickness of about 200 nm. The top electrode and SBT layers were milled (dry etch) to form capacitors, and then ashing was performed. A post-TE RTP treatment in accordance with the invention was conducted at a hold temperature of 750° C. for 120 seconds in $O_2$ gas, with a ramping rate of 100° C. per second. Thus, the cumulative heating time was about 2.5 minutes. The contribution of the post-TE RTP to the thermal budget was 90,000° C.-sec, and the total thermal budget of the fabrication method was 109,500° C.-sec. The resulting ferroelectric capacitors had a surface area of 7854 $\mu m^2$ (100 $\mu m$ diameter).

The process conditions are summarized here:

| | |
|---|---|
| Substrate: | $Si/SiO_2/Pt$ |
| Solution: | MOD $Sr_{0.9}Bi_{2.2}Ta_2O_9$, 0.06 molar |
| Deposition: | Spin-on, 1 layer @ 2500 rpm for 25 nm |
| Baking: | $1^{st}$ plate @ 160° C./1 min. $2^{nd}$ plate @ 260° C./4 min. |
| Pre-TE RTP: | 650° C./30 sec. in $O_2$ |
| TE: | 2000A Pt |
| TE/FE etch: | Dry etch |
| Post-TE RTP: | 750° C./120 sec. in $O_2$ |
| Thermal budget: | 109,500° C.-sec |

Figure 6:
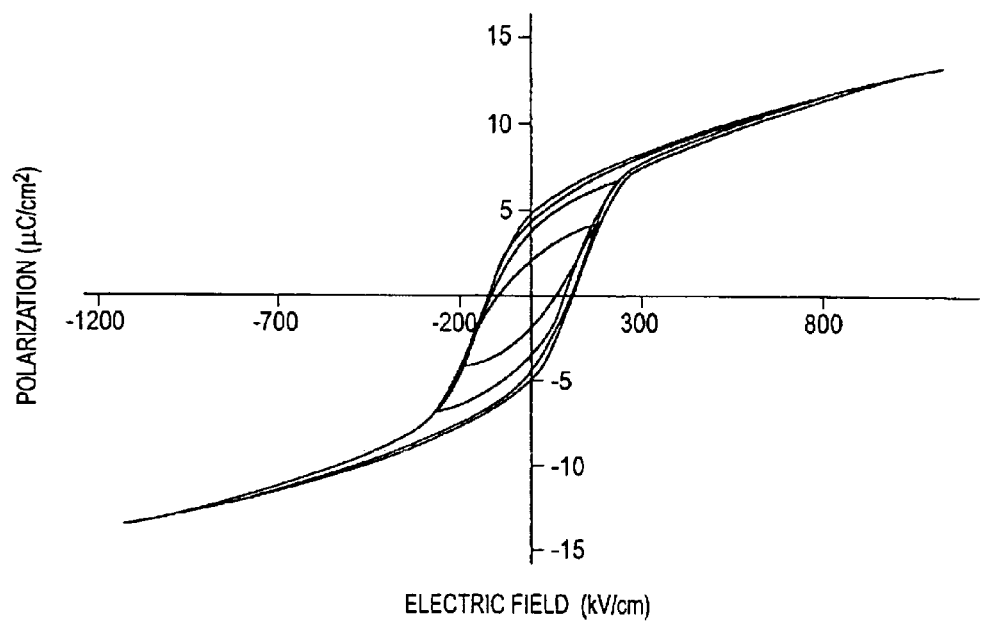
FIG. 6 contains a graph in which the polarization value, in units of $\mu C/cm^2$, is plotted as a function of applied field, in units of kV/cm, measured in a representative exemplary capacitor fabricated in accordance with the invention.
Figure 7:
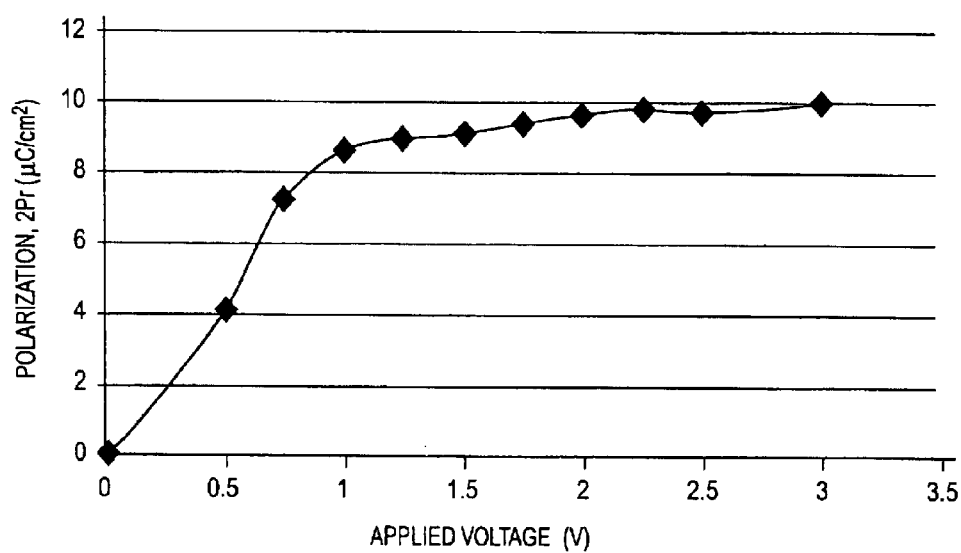
FIG. 7 contains a graph in which polarization, in units of $\mu C/cm^2$, is plotted as a function of applied voltage, measured in a representative exemplary capacitor fabricated in accordance with the invention.
Figure 8:
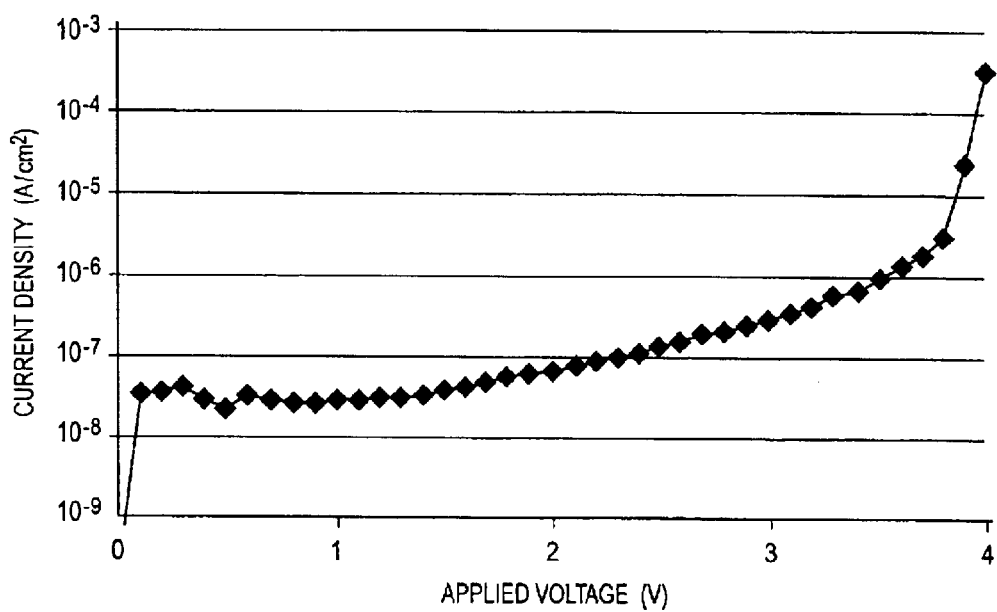
FIG. 8 contains a graph of current density, in units of $A/cm^2$, plotted as a function of applied voltage, measured in a representative exemplary ultra-thin 25-nm capacitor fabricated in accordance with the invention.

The polarization of a representative exemplary capacitor was measured at a series of voltage values and the resulting hysteresis curves are plotted in the graph of FIG. 6. In FIG. 6, the polarization value, in units of $\mu C/cm^2$, is plotted as a function of applied field, in units of kV/cm. When measured at 3 volts, the remanent polarization value, 2Pr, was about 10 $\mu C/cm_2$. At 1 volt, the remanent polarization value, 2Pr, was about 9 $\mu C/cm^2$. The coercive voltage was about 0.25 volts, which corresponds to a coercive field of about 200 kV/cm. In FIG. 7, polarization, in units of $\mu C/cm^2$, is plotted as a function of applied voltage. Saturation voltage is the voltage at which remanent polarization, Pr, does not increase more than about ten percent even as voltage is increased without limit. FIG. 7 shows that the exemplary capacitor had a saturation voltage of about 1.1 volts. FIG. 8 is a graph of current density measured in a representative exemplary ultra-thin 25-nm capacitor, in units $A/cm^2$, plotted as a function of applied voltage. FIG. 8 shows that at 3 volts the leakage current was less than $10^{-6}$ $A/cm^2$, and at 1 volt it was less than $10^{-7}$ $A/cm^2$. The breakdown voltage, $V_B$, was about 3.7 V, corresponding to a breakdown field, $F_B$, of approximately 1500 kV/cm.

Figure 9:
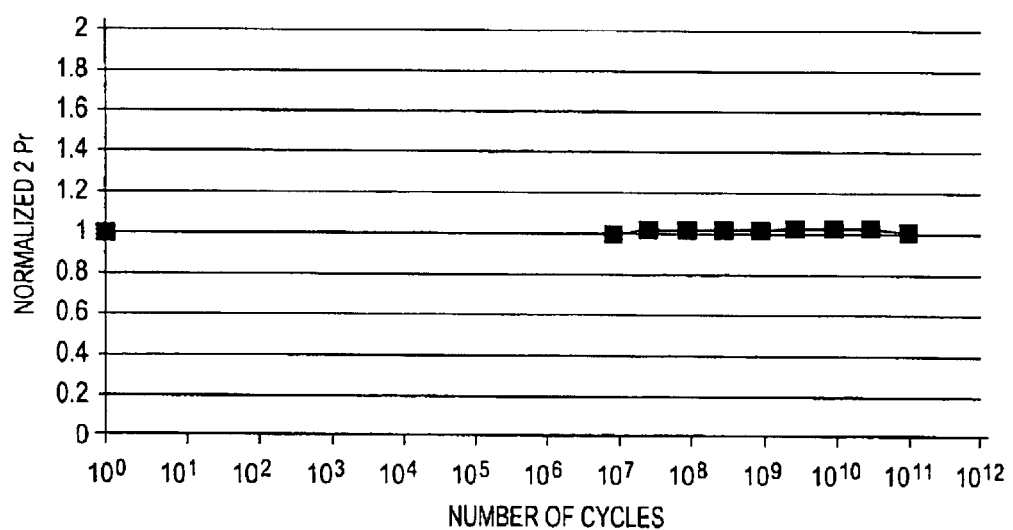
FIG. 9 shows the fatigue behavior of an exemplary ultra-thin 25-nm capacitor fabricated in accordance with the invention.
Figure 10:
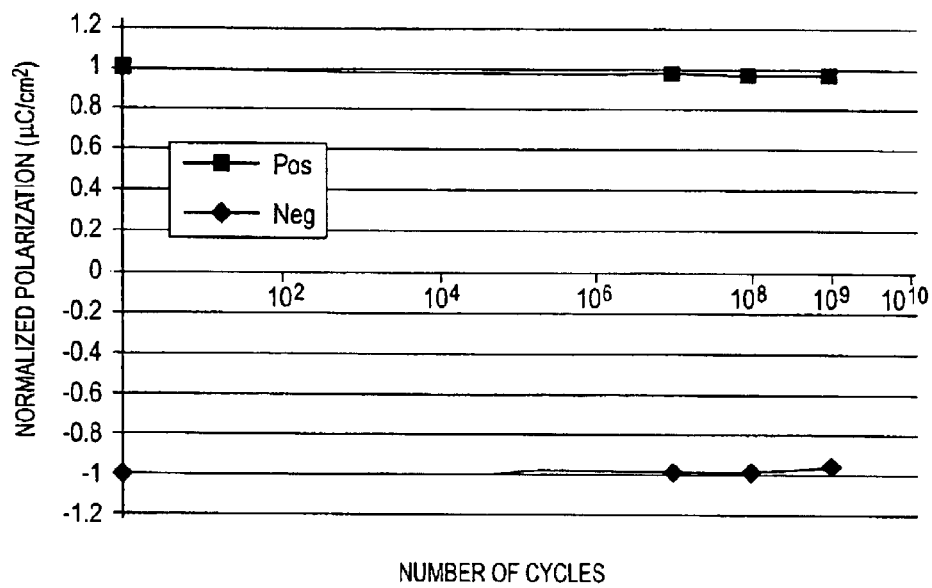
FIG. 10 depicts a graph in which normalized polarization is plotted as a function of the number of applied unidirectional pulses resulting from PUND measurements of an exemplary ultra-thin 25-nm capacitor fabricated in accordance with the invention.

FIG. 9 shows the fatigue behavior of an exemplary ultra-thin 25-nm capacitor. Fatigue cycling was conducted with $10^{11}$ square-wave cycles at 2 MHz in a field of 400 kV/cm. The remanent polarization, 2Pr, was measured at selected intervals during the fatigue cycling, and normalized with the 2Pr-value before fatigue cycling. In the graph of FIG. 9, normalized 2Pr is plotted as a function of the number of fatigue cycles. The data in the graph of FIG. 9 indicate that there was virtually no degradation in polarizability after $10^{11}$ square-wave cycles.

Figure 11:
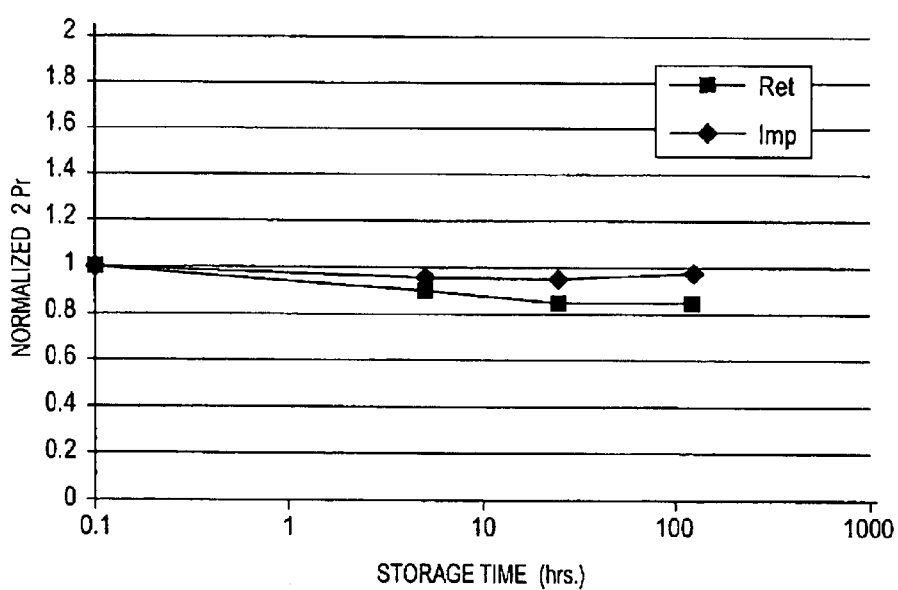
FIG. 11 presents results of a retention/static imprint test, conducted at a storage temperature of 125° C. during 100 hours using a series of representative exemplary ultra-thin 25-nm capacitors fabricated in accordance with the invention, in a graph in which normalized 2Pr-values are plotted as a function of retention time, in units of hours.

Two PUND tests were conducted using exemplary capacitors. PUND measurements are described in U.S. Pat. No. 6,281,534 B1 issued Aug. 28, 2001 to Arita et al., which is hereby incorporated by reference. In Test 1, which tested the dynamic imprint, initial PUND measurements were conducted by applying a series of unidirectional switching pulses having an amplitude of 1 volt with a rise time of 30 ns, a fall time of 30 ns, and a pulse width of one microsecond, with a pulse delay of 75 ns between pulses. Following the initial PUND-curve measurements, $10^9$ positive square-wave voltage imprint pulses were applied to the ferroelectric capacitors at 75° C., a frequency of 1 MHz, each pulse having an amplitude of 3 volts, resulting in a field strength of 400 kV/cm. The results of Test 1 are presented in the graph of FIG. 10, in which normalized polarization is plotted as a function of the number of applied unidirectional pulses. The results in FIG. 10 indicate a decrease of about 3 percent to 5 percent in polarizability in both the positive and negative directions of a representative capacitor after $10^9$ cycles. Test 2, which tested retention/static imprint, was conducted at a storage temperature of 125° C. during 100 hours using a series of exemplary capacitors. At selected retention times, a program/read voltage of 1 volt was applied to exemplary capacitors to test static imprint characteristics. Results are presented in the graph of FIG. 11, in which normalized 2Pr-values are plotted as a function of retention time, in units of hours. The square-shaped "retention" data points plotted in the graph of FIG. 11 show that the charge, or polarization, on a representative capacitor decreased gradually to about 85 percent of the initial value during the storage period of 100 hours. The diamond-shaped data points and associated "imprint" curve indicate that the polarizability of another representative capacitor did not decrease significantly during the storage period of 100 hours at 125° C.

EXAMPLE 2

A substrate wafer was prepared and ferroelectric capacitors were fabricated using a low thermal budget in accordance with the invention, as in Example 1, except that the liquid spin-on layer was spun at 2000 rpm instead of 2500 rpm. As a result, the ultra-thin film of SBT layered superlattice material had a thickness of about 35 nm, instead of 25 nm. The polarizability, expressed as the 2Pr-value, of the 35-nm capacitors was about 11.5 $\mu C/cm^2$ measured at 3 volts. The 2Pr-value measured at 1 volt was about 10.4 $\mu C/cm^2$. The coercive voltage measured was about 0.3 volts, which corresponds to a coercive field, Ec, of about 170 kV/cm.

EXAMPLE 3

Ferroelectric capacitors containing an ultra-thin film of SBT layered superlattice material were fabricated using a low thermal budget in accordance with the invention by applying a single spin-on layer of liquid precursor on a substrate prepared as in Example 1. Thus, the cumulative heating time was about 2.5 minutes. The ultra-thin films of SBT had a thickness of about 48 nm. The fabrication conditions are summarized here:

| Substrate: | Si/SiO$_2$/Pt |
|---|---|
| Solution: | MOD Sr$_{0.9}$Bi$_{2.2}$Ta$_2$O$_9$, 0.08 molar |
| Deposition: | Spin-on, 1 layer @ 1500 rpm |
| Baking: | 1$^{st}$ plate @ 160° C./1 min. |
| | 2$^{nd}$ plate @ 260° C./4 min. |
| Pre-TE RTP: | 625° C./30 sec. in O$_2$ |
| TE: | 2000A Pt |
| TE/FE etch: | Dry etch |
| Post-TE RTP: | 750° C./120 sec. in O$_2$ |
| Thermal budget: | 118,750° C.-sec |

Another set of ferroelectric capacitors were fabricated in accordance with the invention on another substrate wafer by applying two spin-on layers of liquid precursor solution. The operating conditions are summarized here:

| Substrate: | Si/SiO$_2$/Pt |
|---|---|
| Solution: | MOD Sr$_{0.9}$Bi$_{2.2}$Ta$_2$O$_9$, 0.06 molar |
| Deposition: | Spin-on, 2 layers @ 3000 rpm each |
| Baking: | 1$^{st}$ plate @ 160° C./1 min. |
| | 2$^{nd}$ plate @ 260° C./4 min. |
| Pre-TE RTP: | 650° C./30 sec. in O$_2$, after baking each layer |
| TE: | 200 nm Pt |
| TE/FE etch: | Dry etch |
| Post-TE RTP: | 750° C./120 sec. in O$_2$ |
| Thermal budget: | 129,000° C.-sec |

The thickness of the ferroelectric thin film in each set of capacitors was about 48 nm. The cumulative heating time at elevated temperature was about 3.0 minutes. The ferroelectric and electronic properties of the ferroelectric capacitors were measured and representative results are presented in Table 1.

sets of exemplary capacitors having a thickness of 48 nm possessed a polarizability, 2Pr, of about 11.5 μC/cm$^2$ measured at 3 volts. Their coercive field, 2Ec, was about 150 kV/cm. Both sets of capacitors had acceptable leakage current densities measured at 3 volts, although the current measured in the 2L (2 spin-on layers) capacitor was about a factor of ten less than in the 1L capacitor. The 2L capacitor had a breakdown field, F$_B$, of 950 kV/cm, which is better than the breakdown field of 840 kV/cm of the 1L-capacitor. The relative dielectric constant, ∈, of the ferroelectric SBT material in both the 1L and the 2L capacitors was about 300.

EXAMPLE 4

Ferroelectric capacitors containing a thin film of SBT layered superlattice material were fabricated using a low thermal budget in accordance with the invention by applying a single spin-on layer of liquid precursor on a substrate prepared as in Example 1. The thin films of SBT had a thickness of about 60 nm. The fabrication conditions are summarized here:

| Substrate: | Si/SiO$_2$/Pt |
|---|---|
| Solution: | MOD Sr$_{0.9}$Bi$_{2.2}$Ta$_2$O$_9$, 0.1 molar |
| Deposition: | Spin-on, 1 layer @ 2000 rpm |
| Baking: | 1$^{st}$ plate @ 160° C./1 min. |
| | 2$^{nd}$ plate @ 260° C./4 min. |
| Pre-TE RTP: | 625° C./30 sec. in O$_2$ |
| TE: | 200 nm Pt |
| TE/FE etch: | Dry etch |
| Post-TE RTP: | 700° C./60 sec or 750° C./120 sec. in O$_2$ |
| Thermal budget: | 60,750° C.-sec or 108,750° C.-sec |

Thus, the cumulative heating time at elevated temperature was about 1.5 min., or alternatively about 2.5 minutes. Additionally, a set of ferroelectric capacitors was fabricated using a "high thermal budget". Ferroelectric capacitors were formed on a substrate wafer using the same operating conditions described immediately above, and then substrates were annealed in a diffusion furnace at 700° C. for 60 minutes in O$_2$. Thus, the cumulative heating time in the high-thermal-budget process was approximately 62 minutes. The ferroelectric and electronic properties of the capacitors

TABLE 1

| Wafer ID | Pre-TE + post-TE RTP | Film Thickness (nm) | 2Pr @ 3 V | 2E$_c$ (kV/cm) | Leakage @ 3 V (A/cm$^2$) | F$_B$ [kV/cm] | ∈$_r$ |
|---|---|---|---|---|---|---|---|
| 15-1 | 625/30 + 700/120 2Ls | 47.5 | 11.46 | 148.66 | 1.4 e−7 | 950 | 290 |
| 15-2 | 625/30 + 700/120 1L | 47.5 | 11.57 | 151.97 | 1.2 e−6 | 840 | 305 |

An exemplary capacitor fabricated using two spin-on layers, 2Ls in Table 1, possessed characteristics similar to a capacitor fabricated using one spin-on layer, 1L. Thus, both were measured, and representative measurements are presented in Table 2.

TABLE 2

| Wafer ID | Post-TE Heating | Film Thickness (nm) | 2Pr @ 3 V | 2E$_c$ (kV/cm) | Leakage @ 3 V | F$_B$ [kV/cm] |
|---|---|---|---|---|---|---|
| 11-1 | RTP 700° C./60 sec + 700° C. | 60 | 13.75 | 127.94 | 4 e−7 | 950 |

TABLE 2-continued

| Wafer ID | Post-TE Heating | Film Thickness (nm) | 2Pr @ 3 V | 2E$_c$ (kV/cm) | Leakage @ 3 V | F$_B$ [kV/cm] |
|---|---|---|---|---|---|---|
| 11-3 | Furnace/60 min RTP 700° C./60 sec | 60 | 11.69 | 142.30 | 2.e−6 | 580 |
| 11-4 | RTP 700° C./120 sec | 60 | 13.40 | 138.45 | 5 e−6 | 580 |

A representative capacitor formed using a low thermal budget method in accordance with the invention in which the substrate was treated with a post-TE RTP at 700° C. for 120 seconds had a 2Pr-value of 13.40 $\mu$C/cm$^2$ measured at 3 volts, which was only slightly less than the value of 13.75 $\mu$C/cm$^2$ of the capacitor subjected to a furnace anneal at 700° C. in oxygen for 60 minutes. The capacitor treated by a post-TE RTP at 700° C. for only 60 seconds had a 2Pr-value of 11.69 $\mu$C/cm$^2$ measured at 3 volts, which is suitable for most applications. The coercive field of the low-thermal-budget capacitors was about 140 kV/cm, slightly less than in the furnace-annealed capacitor. The leakage current density was about a factor of ten higher in the low-thermal budget capacitors, but in an acceptable range. The breakdown field in the furnace-annealed capacitor was about 920 kV/cm, compared to about 580 kV/cm in the low-thermal-budget capacitors.

EXAMPLE 5

Ferroelectric capacitors containing a thin film of SBT layered superlattice material were fabricated using a low thermal budget in accordance with the invention by applying two spin-on layers of liquid precursor on substrate wafers prepared as in Example 1. The thin films of SBT had a thickness of about 125 nm. The fabrication conditions are summarized here:

| | |
|---|---|
| Substrate: | Si/SiO$_2$/Pt |
| Solution: | MOD Sr$_{0.9}$Bi$_{2.2}$Ta$_2$O$_9$, 0.1 molar |
| Deposition: | 1$^{st}$ layer--Spin-on 2000 rpm |
| Baking: | 160° C./1 min. + 260° C./4 min. |
| Pre-TE RTP: | 1$^{st}$ layer - 675° C./30 sec. in O$_2$ |
| Deposition: | 2$^{nd}$ layer--Spin-on 2000 rpm, 1$^{st}$ layer |
| Baking: | 160° C./1 min. + 260° C./4 min. |
| Pre-TE RTP: | 2nd layer - 725° C./60 sec. in O$_2$ |
| TE: | 200 nm Pt |
| TE/FE etch: | Dry etch |
| Post-TE RTP: | 675° C. or 725° C. /30 sec. in O$_2$; |

-continued

| | |
|---|---|
| Thermal budget: | 675° C. or 725° C. /30 sec. in N$_2$ 84,000° C.-sec or 85,500° C.-sec |

Thus, the cumulative heating time at elevated temperature was about 2.0 minutes, and the thermal budget was about 85,000° C.-sec. The contribution of the first-layer pre-TE RTP treatment to the thermal budget was 20,250° C.-sec, and the contribution of the second-layer pre-TE RTP treatment was 43,500° C.-sec. The contribution of the post-TE RTP treatment to the thermal budget was 20,250° C.-sec, or alternately 21,750° C.-sec. The ferroelectric and electronic properties of the capacitors were measured, and representative measurements are presented in Table 3.

TABLE 3

| Wafer ID | Post-TE RTP | Film Thickness (nm) | 2Pr @ 3 V | 2E$_c$ kV/cm | Leakage @ 3 V | F$_B$ kV/cm |
|---|---|---|---|---|---|---|
| 29-1 | 675° C./30 sec. in O$_2$ | 125 | 19.00 | 111.58 | 5 e−8 | 720 |
| 29-2 | 675° C./30 sec. in N$_2$ | 125 | 19/55 | 111.26 | 7 e−8 | 400 |
| 29-3 | 725° C./30 sec. in O$_2$ | 125 | 19.62 | 113.33 | 1 e−7 | 640 |
| 29-4 | 725° C./30 sec. in N$_2$ | 125 | 18.11 | 110.89 | 8 e−8 | 480 |

The measured values of 2Pr, 2Ec and leakage current for all of the SBT capacitors were substantially the same, whether the post-TE RTP was conducted in oxygen or nitrogen gas. Capacitors treated by post-TE RTP in N$_2$ gas exhibited a breakdown field of about 450 kV/cm, as opposed to a breakdown field of about 680 kV/cm in capacitors post-TE RTP-treated in oxygen gas.

EXAMPLE 6

Ferroelectric capacitors containing a thin film of SBT layered superlattice material were fabricated using a low thermal budget in accordance with the invention by applying two spin-on layers of liquid precursor on a substrate wafer prepared as in Example 1. In addition, approximately half of the capacitors were treated using a furnace anneal in O$_2$-gas at 550° C. for 30 minutes. The thin films of SBT had a thickness of about 120 nm. The fabrication conditions are summarized here:

| | |
|---|---|
| Substrate: | Si/SiO$_2$/Pt |
| Solution: | MOD Sr$_{0.9}$Bi$_{2.2}$Ta$_2$O$_9$, 0.1 molar |
| Deposition: | 1$^{st}$ layer--Spin-on 2000 rpm |
| Baking: | 160° C./1 min. + 260° C./4 min. |

-continued

| | |
|---|---|
| Pre-TE RTP: | 1st layer - 675° C./30 sec. in $O_2$ |
| Deposition: | 2nd layer--Spin-on 2000 rpm, 1st layer |
| Baking: | 160° C./1 min. + 260° C./4 min. |
| Pre-TE RTP: | 2nd layer - 725° C./60 sec. in $O_2$ |
| TE: | 200 nm Pt |
| TE/FE etch: | Dry etch |
| Post-TE RTP: | 625° C. or 575° C. /30 sec. in $N_2$ |
| Furnace Anneal: | 550° C./30 min. in $O_2$ on halves A only |
| Thermal budget: | 82,500° C.-sec or 81,000° C.-sec (with no furnace anneal) |

The contribution of the first-layer pre-TE RTP treatment to the thermal budget was 20,250° C.-sec, and the contribution of the second-layer pre-TE RTP treatment was 43,500° C.-sec. The contribution of the post-TE RTP treatment was 18,750° C.-sec, or alternately 17,250° C.-sec. The ferroelectric and electronic characteristics of representative capacitors were calculated from measurements. The calculated values are presented in Table 4.

TABLE 4

| Wafer ID | Post-TE RTP | Film Thickness (nm) | 2Pr @ 3 V | 2$E_c$ kV/cm | Leakage @ 3 V | $F_B$ kV/cm |
|---|---|---|---|---|---|---|
| 7-1 | 625° C./30 sec. in $N_2$ | 120 | 18.58 | 109.09 | 9.5 e−8 | 790 |
| 7-2 | 625° C./30 sec. in $N_2$ | 120 | 19.10 | 106.97 | 1.0 e−7 | 830 |
| 7-3 | 575° C./30 sec. in $N_2$ | 120 | 18.72 | 107.57 | 6.9 e−8 | 750 |
| 7-4 | None | 120 | Shorting | | | |
| 7-1A | 625° C./30 sec. + 550 | 120 | 17.78 | 109.43 | 5.2 e−8 | 830 |
| 7-2A | 625° C./30 sec. + 550 | 120 | 18.64 | 107.89 | 7.0 e−8 | 790 |
| 7-3A | 575° C./30 sec. + 550 | 120 | 18.24 | 108.73 | 5.6 e−8 | 750 |
| 7-4A | None + 550 | 120 | Shorting | | | |

The good polarizability of representative low-thermal-budget (LTB) capacitors treated with a post-TE RTP for 30 seconds, but with no furnace anneal, was unexpected (cumulative heating time at elevated temperature was about 2.0 minutes). Having a fraction of the thermal budget of high-thermal-budget of capacitors, which received a 30-minute oxygen furnace anneal at 550° C., the LTB capacitors displayed similarly high 2Pr values of about 18 $\mu C/cm^2$. The good electronic characteristics achieved using a post-TE RTP treatment at a hold temperature of less than 600° C. in $N_2$-gas for only 30 seconds indicate generally the utility of LTB methods in accordance with the invention for decreasing fabrication costs and improving integrated circuit quality by minimizing the time of exposure of the circuit to elevated temperatures and to oxidizing conditions.

It was previously believed that layered superlattice materials required heating treatments at elevated temperatures of at least 700° C. for a total duration of 60 minutes or more.

In other exemplary operations in accordance with the invention, ferroelectric memory capacitors containing thin films of layered superlattice material having a thickness in a range of about from 25 nm to 120 nm were fabricated using a low thermal budget in accordance with the invention together with LSMCD (liquid mist) techniques. Results of measurements of the ferroelectric and other electronic properties of representative capacitors fabricated using LSMCD were similar to the results presented in all Examples 1–6, above.

Figure 12:
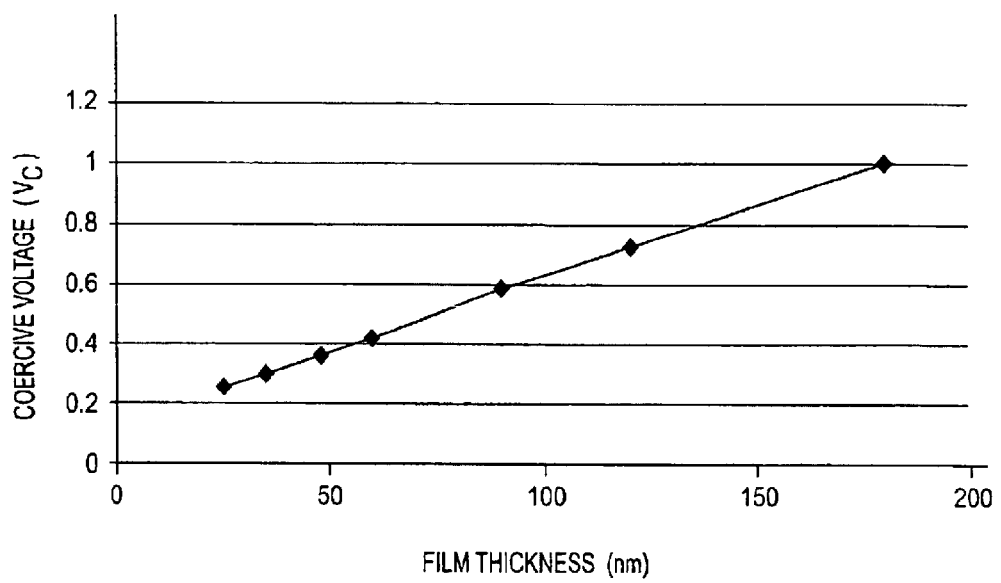
FIG. 12 contains a graph in which coercive voltage is plotted as a function of film thickness, for representative capacitors fabricated in accordance with the invention and having thin film thicknesses in a range of from 25 nm to 180 nm.

The coercive voltage, $V_c$, was measured in representative capacitors having thin films of layered superlattice material fabricated in accordance with the invention and having thin film thicknesses in a range of from 25 nm to 180 nm. In FIG. 12, coercive voltage is plotted as a function of film thickness. The data plotted in FIG. 12 indicate a substantially linear relationship between coercive voltage and film thickness.

Figure 13:
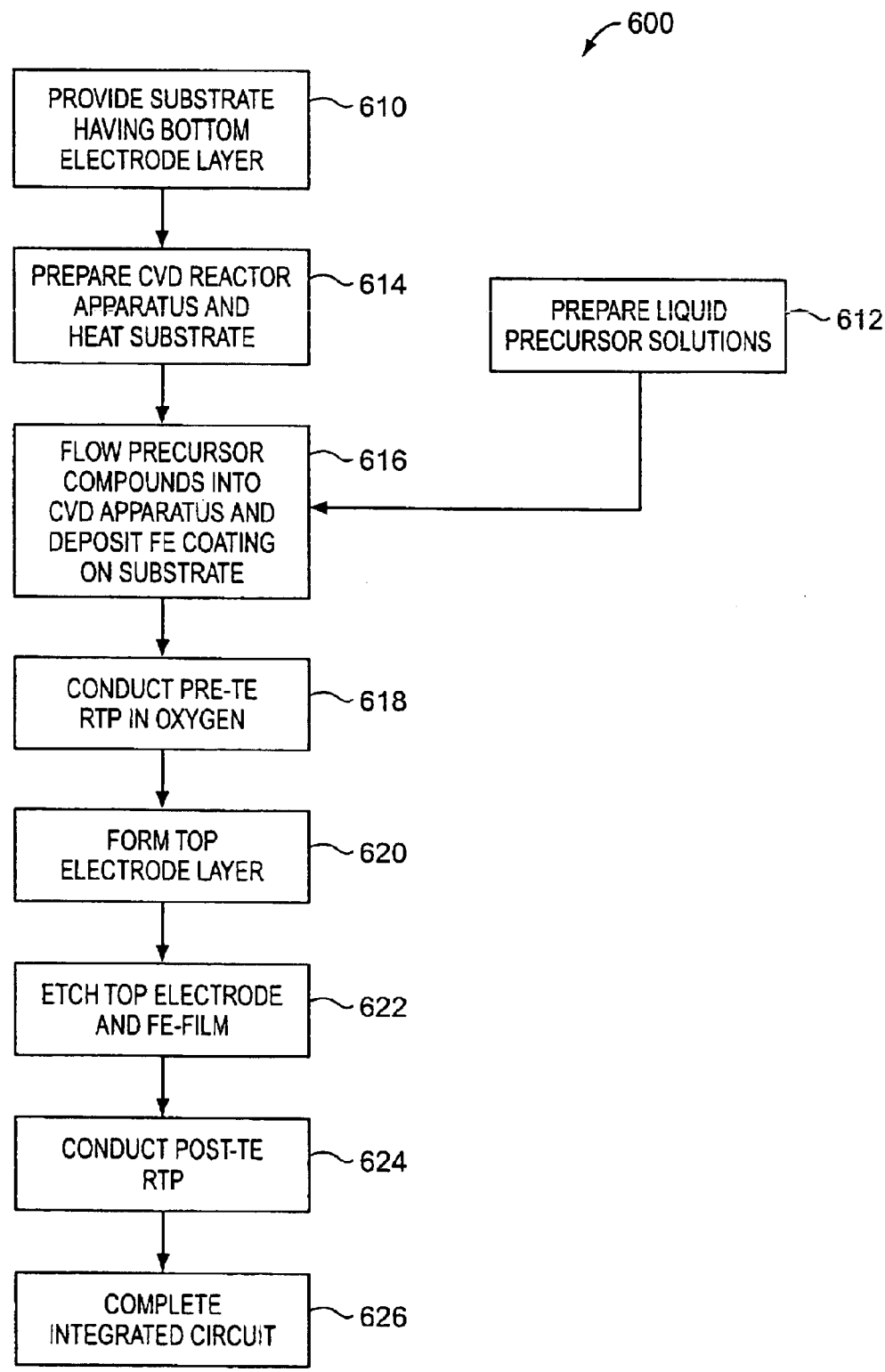
FIG. 13 is a generalized flow chart of a method utilizing a MOCVD technique in accordance with the invention for fabricating a memory cell containing a thin film of layered superlattice material.

The diagram of FIG. 13 is a flow sheet of a generalized LTB method 600 in accordance with the invention utilizing MOCVD to make a ferroelectric memory containing a thin film of ferroelectric strontium bismuth tantalate.

In processes 610, an integrated circuit substrate including a switch and a bottom electrode layer is provided and placed in a substrate holder of a chemical-vapor-deposition ("CVD") apparatus. In process 612, liquid precursor solutions are prepared; for example, as explained above and as described in U.S. Pat. No. 6,110,531 issued Aug. 29, 2000 to Paz de Araujo et al. Preferably, a bismuth precursor comprising triphenyl bismuth in n-butyl acetate and a strontium-tantalum precursor comprising a SrTa-double-alkoxide in toluene are prepared. Preferably, the liquid precursor solutions each have a concentration of about 0.05 M.

In processes 614, the CVD reactor apparatus is prepared and the substrate is heated. Preferably, the CVD reaction chamber is heated to a temperature in a range of about from 400° C. to 500° C., preferably about 450° C. Typically, the CVD reaction chamber is heated using an IR lamp. Preferably, the CVD reaction chamber is pumped down to a pressure in a range of about from 5 mbar to 7 mbar. Preferably, a substrate heater is maintained at a temperature of about 170° C. in the reaction chamber, and the substrate is rotated at about 10 rpm. The liquid delivery system of the CVD apparatus is maintained at about 200° C. and at about the same pressure as a reaction chamber, that is, about 5 mbar to 7 mbar.

In processes 616, the two liquid precursors flow through the liquid delivery system, where they are heated by a furnace-type heater to about 200° C. and injected directly into a vaporizer at 200° C. and 5 mbar to 7 mbar. The vaporized precursor compounds are carried by inert carrier gas into the reaction chamber. Oxygen gas is also flowed into the reaction chamber. When the liquid flow rates of each of the two liquid precursor streams is about 0.1 ccm to 0.3 ccm, then the flow rate of inert carrier gas is about 200 ccm and the flow rate of $O_2$ gas is about 1500 ccm. The resulting deposition rate of a FE coating on the bottom-electrode substrate is about 8 nm/min.

In processes 618, a pre-TE RTP treatment of the FE coating is conducted at a temperature in a range of about from 500° C. to 900° C., for a time period in the range of about from 5 seconds to 5 minutes. Preferably, the pre-TE RTP is conducted at a temperature of about from 550° C. to 700° C. for 30 seconds with an actual ramping rate in a range of from 10° C. to 200° C. per second, preferably about 100° C. per second.

In processes 620, a top electrode layer is formed on the FE thin film, typically by sputtering. In processes 622, the top electrode layer and the ferroelectric film are patterned and etched together using conventional photolithography techniques and ion beam milling.

In processes 624, a post-top-electrode ("post-TE") RTP treatment of the substrate is conducted. The post-TE RTP in processes 624 is typically performed at a temperature in a range of from 500° C. to 900° C., preferably in a range of about 550° C. to 800° C., for a time period in a range of about from 5 seconds to 5 minutes. Conducting a post-TE RTP in processes 624 in an unreactive gas, such as helium, argon, and nitrogen, achieves substantially the same result as when conducted in oxygen. Conducting a post-TE RTP in a nonreactive gas decreases exposure of the integrated circuit to oxygen at elevated temperature.

An advantage of using CVD for depositing a FE layer is that chemical vapor deposition provides good step coverage and is well-suited for depositing material on a substrate having nonplanar features. Improved designs of integrated circuit memories include nonplanar ferroelectric thin films, such as thin films of layered superlattice material formed in trenches and vias, thin films covering sidewalls, and thin films having various other, three-dimensional shapes.

EXAMPLE 7

Ferroelectric thin film capacitors, as depicted in FIGS. 4 and 5, containing a thin film of strontium bismuth tantalate layered superlattice material having a thickness of approximately 100 nm, were fabricated in a modified low thermal budget method utilizing MOCVD in accordance with the invention. Electronic and ferroelectric properties, including remanent polarization, coercive field, leakage current, and fatigue behavior, of representative capacitors were measured.

Each of a series of P-type 100 Si wafer substrates 502 was oxidized to form a layer of silicon dioxide 504. The substrate was dehydrated in a vacuum oven at 180° C. for 30 minutes. Then a bottom platinum electrode 508 layer having a thickness of 200 nm was sputter-deposited on the substrate, using an argon atmosphere, 8 mTorr pressure and 0.53 amps. On each wafer, the bottom electrode layer was pre-annealed at 650° C. for 30 minutes in $O_2$ gas flowing at 6 l/m, using 10 minute push-pull. A dehydration bake was conducted in a vacuum oven at 180° C. for 30 minutes.

SBT thin films were fabricated using liquid precursor solutions obtained from the Kojundo Chemical Corporation. A SrTa solution comprised a 0.05 M strontium tantalum oxide solution in toluene. A bismuth solution comprised a 0.05 M solution of triphenyl bismuth in n-butyl acetate.

Each 4-inch wafer was processed by MOCVD in a commercially-available AIXTRON Model 1802 CVD apparatus. Each wafer was heated to approximately 170° C. and rotated at approximately 10 rpm. The reaction chamber and liquid delivery systems were maintained at a pressure of approximately 6 mbar. The reaction-chamber space was heated to a temperature of about 450° C. Liquid flow streams of approximately 0.2 ccm of each of the SrTa precursor and the bismuth precursor were heated to 200° C. in the liquid delivery system and vaporized at 200° C. and 6 mbar. Argon carrier gas at a flow rate of approximately 200 ccm carried the vaporized precursors into the reaction chamber into which approximately 1500 ccm of oxygen gas also flowed. A ferroelectric ("FE") coating was deposited on the bottom electrode substrate at a rate of about 8 nm/min. Then the FE coating on the substrate was pre-TE RTP-treated in accordance with the invention at 725° C. for 2 minutes in $O_2$ gas, with a ramping rate of 100° C. per second to form a SBT thin film having a thickness of about 100 nm.

Next, platinum was sputter-deposited on the SBT thin film to make a top electrode layer having a thickness of about 200 nm. The top electrode and SBT layers were milled (dry etch) to form capacitors, and then ashing was performed. Then a furnace recovery anneal in accordance with a modified low thermal budget method of the invention was conducted at a hold temperature of 650° C. for 30 minutes in $O_2$ gas. The resulting ferroelectric capacitors had a surface area of 7854 $\mu m^2$.

The measured composition of the ferroelectric thin film corresponded to the stoichiometric formula $Sr_{0.78}Bi_{2.15}Ta_2O_9$. The polarizability, 2Pr-value, of representative capacitors was measured to be 18.2 $\mu C/cm^2$ at 3 V, and 18.9 $\mu C/cm^2$ at 5 V. The measured coercive field, 2Ec, was 139.5 kV/cm at 3 V, and 146.9 kV/cm at 5 V. The saturation voltage was about 1.9 V. In a similar representative capacitor, having a ferroelectric thin film of thickness 940 nm, the measured leakage current was about $3 \times 10^{-7}$ $A/cm^2$ at 3 V, and about $10^{-5}$ $A/cm^2$ at 5 V. Fatigue cycling was conducted with $10^{10}$ square-wave cycles at 1 MHz in a field of 300 kV/cm. The remanent polarization, 2Pr, was measured at selected intervals during the fatigue cycling, and normalized with the 2Pr-value before fatigue cycling. The measured data indicate that after $10^{10}$ square-wave cycles, there was less than five percent degradation in polarizability, and less than five percent change in coercive field.

EXAMPLE 8

Ferroelectric thin film capacitors, as depicted in FIGS. 4 and 5, containing a thin film of strontium bismuth tantalate layered superlattice material having a thickness of approximately 50 nm, were fabricated in a low thermal budget method utilizing MOCVD in accordance with the invention. Electronic and ferroelectric properties, including remanent polarization, coercive field, leakage current, and fatigue characteristics of representative capacitors were measured.

Each of a series of P-type 100 Si wafer substrates 502 was oxidized to form a layer of silicon dioxide 504. The substrate was dehydrated in a vacuum oven at 180° C. for 30 minutes. Then a bottom platinum electrode 508 layer having a thickness of 200 nm was sputter-deposited on the substrate, using an argon atmosphere, 8 mTorr pressure and 0.53 amps. On each wafer, the bottom electrode layer was pre-annealed at 650° C. for 30 minutes in $O_2$ gas flowing at 6 l/m, using 10 minute push-pull. A dehydration bake was conducted in a vacuum oven at 180° C. for 30 minutes.

SBT thin films were fabricated using liquid precursor solutions obtained from the Kojundo Chemical Corporation. A SrTa solution comprised a 0.05 M strontium tantalum oxide solution in toluene. A bismuth solution comprised a 0.05 M solution of triphenyl bismuth in n-butyl acetate.

Each 4-inch wafer was processed using MOCVD in a commercially-available AIXTRON Model 1802 CVD apparatus. The wafer was heated to approximately 170° C. and rotated at approximately 10 rpm. The reaction chamber and liquid delivery systems were maintained at a pressure of approximately 6 mbar. The reaction-chamber space was heated to a temperature of about 450° C. Liquid flow streams of approximately 0.2 ccm of each of the SrTa precursor and the bismuth precursor were heated to 200° C. in the liquid delivery system and vaporized at 200° C. and 6 mbar. Argon carrier gas at a flow rate of approximately 200 ccm carried the vaporized precursors into the reaction chamber into which approximately 1500 ccm of oxygen gas also flowed. A ferroelectric ("FE") coating was deposited on the bottom electrode substrate at a rate of about 8 nm/min. Then the FE coating on the substrate was pre-TE RTP-treated in accordance with the invention at 650° C. for 30 seconds in $O_2$ gas, with a ramping rate of 100° C. per second to form a ferroelectric film.

Next, platinum was sputter-deposited on the SBT thin film to make a top electrode layer having a thickness of about 200 nm. The top electrode and SBT layers were milled (dry etch) to form capacitors, and then ashing was performed. Then, a post-TE RTP treatment in accordance with a low thermal budget method of the invention was conducted at a hold temperature of 725° C. for 2 minutes in $O_2$ gas. The resulting SBT thin films had a thickness of about 50 nm, and the ferroelectric capacitors had a surface area of 7854 $\mu m^2$. Thus, each wafer was heated in the temperature range of about from 650° C. to 725° C. for a cumulative heating time of only about 150 seconds, or 2½ minutes. No furnace annealed was conducted. The contribution of the pre-TE RTP treatment was 19,50° C.-sec, and the contribution of the post-TE RTP treatment was 87,000° C.-sec, resulting in a total thermal budget of 106,500° C.-sec.

The polarizability, 2Pr-value, of representative capacitors was measured to be 19.3 $\mu C/cm^2$ at 1.8 V, and 20.4 $\mu C/cm^2$ at 3 V. The measured coercive field, 2Ec, was 150.4 kV/cm at 1.8 V, and 156.3 kV/cm at 3 V. The measured leakage current was about $2.3 \times 10^{-8}$ $A/cm^2$ at 1.8 V, and about $10^{-7}$ $A/cm^2$ at 3 V. The saturation voltage was about 1.4 V. Fatigue cycling was conducted with $10^{10}$ square-wave cycles at 1 MHz in a field of 300 kV/cm. The remanent polarization, 2Pr, was measured at selected intervals during the fatigue cycling, and normalized with the 2Pr-value before fatigue cycling. The measured data indicate that after $10^{10}$ square-wave cycles, there was substantially no degradation in polarizability, and substantially no change in coercive field.

For comparison, a set of capacitors was fabricated in the same manner as described above, with the exception that there was no pre-TE RTP-treatment of the FE coating prior to deposition of the top electrode layer. Measurements of representative capacitors indicated a polarizability, 2Pr value, of only 5.5 $\mu C/cm^2$ at 1.8 V, and 5.8 $\mu C/cm^2$ at 3 V. Then, a recovery furnace anneal at 700° C. for one hour was conducted. The additional furnace anneal resulted in only a slight improvement of the 2Pr-value to 9.2 $\mu C/cm^2$ at 1.8 V, and 9.4 $\mu C/cm^2$ at 3 V.

It is believed that a pre-TE RTP-treatment of a ferroelectric coating, particularly in an oxygen-containing ambient, is important for achieving good ferroelectric and electronic properties of layered superlattice materials, and for achieving good polarizability, low leakage current, high breakdown voltage, good fatigue behavior and other characteristics of a nonvolatile ferroelectric memory capacitor containing layered superlattice material. It is believed that a pre-TE RTP-treatment of a ferroelectric coating enhances good properties of layered superlattice material and of memory capacitors by, among others: volatilizing solvent and burning off other organic matter from a deposited coating; shrinking the size of the coating to the volume it occupies in a finished integrated circuit; providing oxygen for oxidizing metal atoms in the desired metal oxide; generating nucleation sites for desired crystallization of the layered superlattice material. It is further believed that a post-TE RTP-treatment in accordance with the invention serves, among others: to effect crystallization of the desired layered superlattice material; to enhance adhesion of the thin film of ferroelectric layered superlattice material to the bottom and top electrodes. It is further believed that a low thermal budget in accordance with the invention enhances the performance and improves the structural integrity of integrated circuits compared with integrated circuits fabricated using methods of the prior art having higher thermal budgets.

There has been described a method using RTP for making electronic devices containing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, even though a low thermal budget in accordance with the invention is achieved to a significant degree through the use of RTP heating, it is conceivable that furnace-heating could be conducted for a portion of the cumulative heating time in an embodiment in accordance with the invention. It is also evident that the steps recited may in some instances be performed in a different order; or equivalent structures and processes may be substituted for the various structures and processes described; or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of fabricating a ferroelectric switching memory cell including a thin film of ferroelectric layered superlattice material, said method comprising:

applying a precursor to a substrate to form a coating, said precursor containing metal atoms in effective amounts for forming a ferroelectric layered superlattice material upon heating said precursor;

heating said substrate including said coating using rapid thermal processing (RTP) at a temperature in a range of from 500° C. to 900° C. for a cumulative heating time not exceeding 30 minutes;

completing said memory cell to include said layered superlattice material; and forming a wiring layer on said completed memory cell;

wherein said cumulative heating time comprises the total duration of substrate heating above 500° C. from the point of starting to apply said precursor coating to the substrate to the point of starting to form said wiring layer on the completed memory cell.

2. A method as in claim 1 wherein said cumulative heating time does not exceed 20 minutes.

3. A method as in claim 1 wherein said cumulative heating time does not exceed 10 minutes.

4. A method as in claim 1 wherein said cumulative heating time does not exceed 5 minutes.

5. A method as in claim 1, further characterized by not heating said substrate in a furnace.

6. A method as in claim 1 wherein said heating said substrate comprises conducting a pre-TE RTP-treatment of said substrate including said coating;
said completing comprises forming a top electrode layer on said coating after said pre-TE RTP-treatment; and
wherein said heating said substrate further comprises conducting a post-TE RTP-treatment after forming said top electrode.

7. A method as in claim 6 wherein said conducting a post-TE RTP-treatment is done in a nonreactive gas.

8. A method as in claim 1, further comprising baking said coating on said substrate before said heating said substrate using RTP.

9. A method as in claim 1 wherein said applying a precursor comprises:
applying a first liquid coating on said substrate;
baking said substrate to form a first dried coating;
applying a second liquid coating on said first dried coating; and
baking said substrate and said second liquid coating.

10. A method as in claim 9 wherein said heating said substrate comprises conducting a pre-TE RTP-treatment of said substrate after said baking said second coating;
said completing comprises forming a top electrode layer on said coating after said pre-TE RTP-treatment; and
wherein said heating said substrate further comprises conducting a post-TE RTP-treatment after said forming said top electrode.

11. A method as in claim 10 wherein said conducting a post-TE RTP-treatment is done in a nonreactive gas.

12. A method as in claim 1 wherein said applying a precursor and said heating said substrate comprise:
applying a first liquid coating on said substrate;
baking said first coating to form a first dried coating;
conducting a first pre-TE RTP-treatment of said substrate after said baking said first coating;
applying a second liquid coating on said first coating after said first pre-TE RTP-treatment;
baking said substrate, thereby drying said second liquid coating; and
conducting a second pre-TE RTP-treatment of said substrate after said drying said second liquid coating.

13. A method as in claim 12 wherein said completing comprises forming a top electrode layer on said coating after said second pre-TE RTP-treatment; and
wherein said heating said substrate comprises conducting a post-TE RTP-treatment after said forming said top electrode layer.

14. A method as in claim 13 wherein said conducting said post-TE RTP-treatment is done in a nonreactive gas.

15. A method as in claim 1 wherein said thin film has a thickness not exceeding 90 nm.

16. A method as in claim 1 wherein said thin film has a thickness not exceeding 50 nm.

17. A method as in claim 1 wherein said thin film has a thickness not exceeding 40 nm.

18. A method as in claim 1 wherein said thin film has a thickness not exceeding 30 nm.

19. A method as in claim 1 wherein said layered superlattice material comprises strontium bismuth tantalate.

20. A method as in claim 19 wherein said precursor includes u mole-equivalents of strontium, v mole-equivalents of bismuth, and w mole-equivalents of tantalum, and $0.7 \leq u \leq 1.0$, $2.0 \leq v \leq 2.3$, and $1.9 \leq w \leq 2.1$.

21. A method as in claim 1 wherein said layered superlattice material comprises strontium bismuth tantalum niobate.

22. A method as in claim 21 wherein said precursor includes u mole-equivalents of strontium, v mole-equivalents of bismuth, w mole-equivalents of tantalum, and x equivalents of niobium, and $0.7 \leq u \leq 1.0$, $2.0 \leq v \leq 2.3$, $1.9 \leq w \leq 2.1$, $1.9 \leq x \leq 2.1$ and $1.9 \leq (w+x) \leq 2.1$.

23. A method as in claim 1 wherein said heating comprises conducting a pre-TE RTP-treatment at a temperature in a range of about from 500° C. to 800° C. for a pre-TE RTP heating time in a range of about from 5 seconds to five minutes.

24. A method as in claim 1 wherein said neating comprises conducting a post-TE RTP-treatment at a temperature in a range of about from 500° C. to 800° C. for a post-TE RTP heating time in a range of about from 5 seconds to five minutes.

25. A method as in claim 1 wherein said method has a thermal budget in a range of about from 2,500° C.-sec to 960,000° C.-sec.

26. A method as in claim 1 wherein said applying a precursor comprises:
flowing a metal organic precursor into a CVD reaction chamber containing said substrate.

27. A method of fabricating an integrated circuit including a switching ferroelectric layered superlattice material, comprising:
depositing a precursor coating on a substrate;
heating said coating subsequent to deposition to form a thin film of said switching ferroelectric layered superlattice material; and
completing said integrated circuit including forming a wiring layer;
wherein said heating is conducted having a cumulative thermal budget value in a range of about from 2,500° C.-sec to 960,000° C.-sec and said cumulative thermal budget value comprises the total heating of said coating above 500° C. from the point of starting to deposit said precursor coating on the substrate to the point of starting to form said wiring layer.

28. A method as in claim 27 wherein said thermal budget value does not exceed 240,000° C.-sec.

29. A method as in claim 27 wherein said thermal budget value does not exceed 50,000° C.-sec.

* * * * *